US011222895B2

(12) United States Patent
Wang et al.

(10) Patent No.: US 11,222,895 B2
(45) Date of Patent: Jan. 11, 2022

(54) EMBEDDED MEMORY EMPLOYING SELF-ALIGNED TOP-GATED THIN FILM TRANSISTORS

(71) Applicant: Intel Corporation, Santa Clara, CA (US)

(72) Inventors: Yih Wang, Portland, OR (US); Abhishek Sharma, Hillsboro, OR (US); Van Le, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 16/488,231

(22) PCT Filed: Mar. 22, 2017

(86) PCT No.: PCT/US2017/023657
§ 371 (c)(1),
(2) Date: Aug. 22, 2019

(87) PCT Pub. No.: WO2018/174874
PCT Pub. Date: Sep. 27, 2018

(65) Prior Publication Data
US 2019/0393224 A1 Dec. 26, 2019

(51) Int. Cl.
H01L 27/108 (2006.01)
G11C 11/4074 (2006.01)
(Continued)

(52) U.S. Cl.
CPC .... *H01L 27/10814* (2013.01); *G11C 11/4074* (2013.01); *G11C 11/4085* (2013.01);
(Continued)

(58) Field of Classification Search
CPC ............ G11C 11/4074; G11C 11/4085; G11C 11/4091; G11C 11/4094; H01L 27/10814;
(Continued)

(56) References Cited

U.S. PATENT DOCUMENTS

2002/0085428 A1 7/2002 Kang et al.
2002/0118585 A1* 8/2002 Derner .................. G11C 29/50
365/201

(Continued)

OTHER PUBLICATIONS

Partial Supplementary European Search Report from European Patent Application No. 17901613.4 dated Oct. 8, 2020, 12 pgs.
Extended European Search Report from European Patent Application No. 17901613.4 dated Jan. 19, 2021, 11 pgs.
International Search Report and Written Opinion from PCT/US2017/023657 dated Dec. 14, 2017, 11 pgs.

(Continued)

*Primary Examiner* — Sung Il Cho
(74) *Attorney, Agent, or Firm* — Green, Howard & Mughal LLP

(57) ABSTRACT

Memory devices in which a memory cell includes a thin film select transistor and a capacitor (1TFT-1C). A 2D array of metal-insulator-metal capacitors may be fabricated over an array of the TFTs. Adjacent memory cells coupled to a same bitline may employ a continuous stripe of thin film semiconductor material. An isolation transistor that is biased to remain off may provide electrical isolation between adjacent storage nodes of a bitline. Wordline resistance may be reduced with a wordline shunt fabricated in a metallization level and strapped to gate terminal traces of the TFTs at multiple points over a wordline length. The capacitor array may occupy a footprint over a substrate. The TFTs providing wordline and bitline access to the capacitors may reside substantially within the capacitor array footprint. Peripheral column and row circuitry may employ FETs fabricated over a substrate substantially within the capacitor array footprint.

15 Claims, 14 Drawing Sheets

(51) Int. Cl.
*G11C 11/408* (2006.01)
*G11C 11/4091* (2006.01)
*G11C 11/4094* (2006.01)
*H01L 23/528* (2006.01)
*H01L 49/02* (2006.01)
*H01L 29/24* (2006.01)
*H01L 29/66* (2006.01)
*H01L 29/786* (2006.01)

(52) U.S. Cl.
CPC ...... *G11C 11/4091* (2013.01); *G11C 11/4094* (2013.01); *H01L 23/528* (2013.01); *H01L 27/10817* (2013.01); *H01L 27/10873* (2013.01); *H01L 27/10885* (2013.01); *H01L 27/10891* (2013.01); *H01L 27/10897* (2013.01); *H01L 28/90* (2013.01); *H01L 29/24* (2013.01); *H01L 29/66969* (2013.01); *H01L 29/7869* (2013.01); *H01L 29/78693* (2013.01)

(58) Field of Classification Search
CPC ............... H01L 27/10897; H01L 29/24; H01L 29/7869; H01L 29/78693
USPC ........................................................ 365/149
See application file for complete search history.

(56) References Cited

U.S. PATENT DOCUMENTS

| | | |
|---|---|---|
| 2003/0160272 A1 | 8/2003 | Mandelman et al. |
| 2004/0156225 A1* | 8/2004 | Bhattacharyya .... H01L 27/1203 365/149 |
| 2006/0139988 A1* | 6/2006 | Tran ........................ G11C 7/02 365/149 |
| 2006/0181919 A1 | 8/2006 | Forbes |
| 2012/0026774 A1* | 2/2012 | Shionoiri .............. G11C 11/405 365/72 |
| 2012/0154460 A1* | 6/2012 | Segawa ................ G09G 3/3233 345/690 |
| 2012/0161126 A1* | 6/2012 | Yamazaki ........... H01L 27/1108 257/43 |
| 2014/0284535 A1* | 9/2014 | Saitoh ................. H01L 27/2481 257/2 |
| 2016/0336055 A1* | 11/2016 | Kato .................... H01L 27/1255 |
| 2016/0379719 A1* | 12/2016 | Katoh ..................... H01L 29/24 365/96 |

OTHER PUBLICATIONS

International Preliminary Report on Patentability from PCT/US2017/023657 dated Oct. 3, 2019, 8 pgs.

* cited by examiner

EMBEDDED MEMORY EMPLOYING SELF-ALIGNED TOP-GATED THIN FILM TRANSISTORS

CLAIM OF PRIORITY

This Application is a National Stage Entry of, and claims priority to, PCT Application No. PCT/US2017/023657, filed on 22 Mar. 2017 and titled "EMBEDDED MEMORY EMPLOYING SELF-ALIGNED TOP-GATED THIN FILM TRANSISTORS", which is incorporated by reference in its entirety for all purposes.

BACKGROUND

Embedded memory may be integrated with a host IC as a multi-chip module (MCM) or may be monolithically integrated with a host IC (i.e., both memory and the host IC fabricated on the same chip). For embedded memory applications, reducing the overall memory array footprint helps achieve larger memories and/or reduce device cost. One form of embedded memory is embedded dynamic random access memory (eDRAM). The architecture of eDRAM is based on a 1T-1C cell that includes a "write" or "select" transistor and a storage capacitor. eDRAM may be integrated with a host microprocessor chip (such as a central processing unit or "CPU") at the package level, for example, to form an central processor MCM. Integration of both a memory device and a processor proximate to one another in a same package may, for example, enable communication between the memory device and the processor through a local bus capable of higher bandwidths and/or lower signal latencies relative to separately packaged chips communicating through a printed circuit board (PCB) bus.

For some eDRAM devices, a transistor of a memory cell is fabricated on and/or within a monocrystalline semiconductor during front-end-of-line (FEOL) processing. The capacitor may either be fabricated in the FEOL as well, or fabricated in the back-end-of-line (BEOL). A transistor and capacitor of each cell are electrically coupled through one or more metal interconnect layers formed in the BEOL. The BEOL is the portion of IC fabrication where individual semiconductor devices (whether embedded memory or logic transistors) are interconnected to one another with electrically conductive features such as metal interconnect traces (lines) within a given metallization level and metal-filled conductive vias between multiple metallization levels. These conductive interconnects are embedded in a dielectric material so that the memory device is a monolithic integrated circuit.

FIG. 1A illustrates a top-down plan view of a conventional integrated circuit memory device 11 suitable for eDRAM applications. As shown, memory device 11 has a footprint 8 occupying a chip area that is a function of at least the number of memory cells (i.e., total storage capacity of device), the memory cell density, and the layout of the device. In FIG. 1A, the layout consists of memory cell arrays 11A, 11B, 11C and 11D arranged into quadrants of footprint 8. Within each array, there may be a two-dimensional (2D) array of storage capacitors, which are represented as filled field regions in FIG. 1A. Such a 2D capacitor array may be fabricated in the BEOL with each capacitor in the array implemented as a metal-insulator-metal (MIM) capacitor. Within each memory cell array (e.g., 11A), selection circuitry may be fabricated to allow addressing individual storage capacitors. Such selection circuitry may include a plurality of bitlines 6 and a plurality of wordlines 10. Bitline 6 and wordlines 10 are coupled to respective terminals of a selection transistor that is to pass or block electrical communication with the storage capacitors. The selection transistor may be fabricated as a 2D array of field effect transistors (FETs) employing a monocrystalline semiconductor device layer for at least the transistor channel.

The architecture illustrated in FIG. 1A vertically integrates the storage capacitors with the selection circuitry. However, footprint 8 is increased beyond the area of the memory cell arrays 11A-11D by the area of peripheral circuitry shown unshaded in FIG. 1A. Typical peripheral circuitry includes row circuitry 3 that is electrically coupled to the wordlines, column circuitry 4 that is electrically coupled to the bitlines, and control circuitry 5 that is electrically coupled to the row and column circuitry. Row circuitry 3 may include, for example, wordline drivers. Column circuitry 4 may include, for example, bitline sense amplifiers. Control circuitry 5 may include, for example, logic to coordinate the functions of row circuitry 3 and column circuitry 4. This peripheral circuitry is typically implemented with MOS technology employing FETs that are fabricated concurrently with the select transistors.

BRIEF DESCRIPTION OF THE DRAWINGS

The material described herein is illustrated by way of example, and not by way of limitation, in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
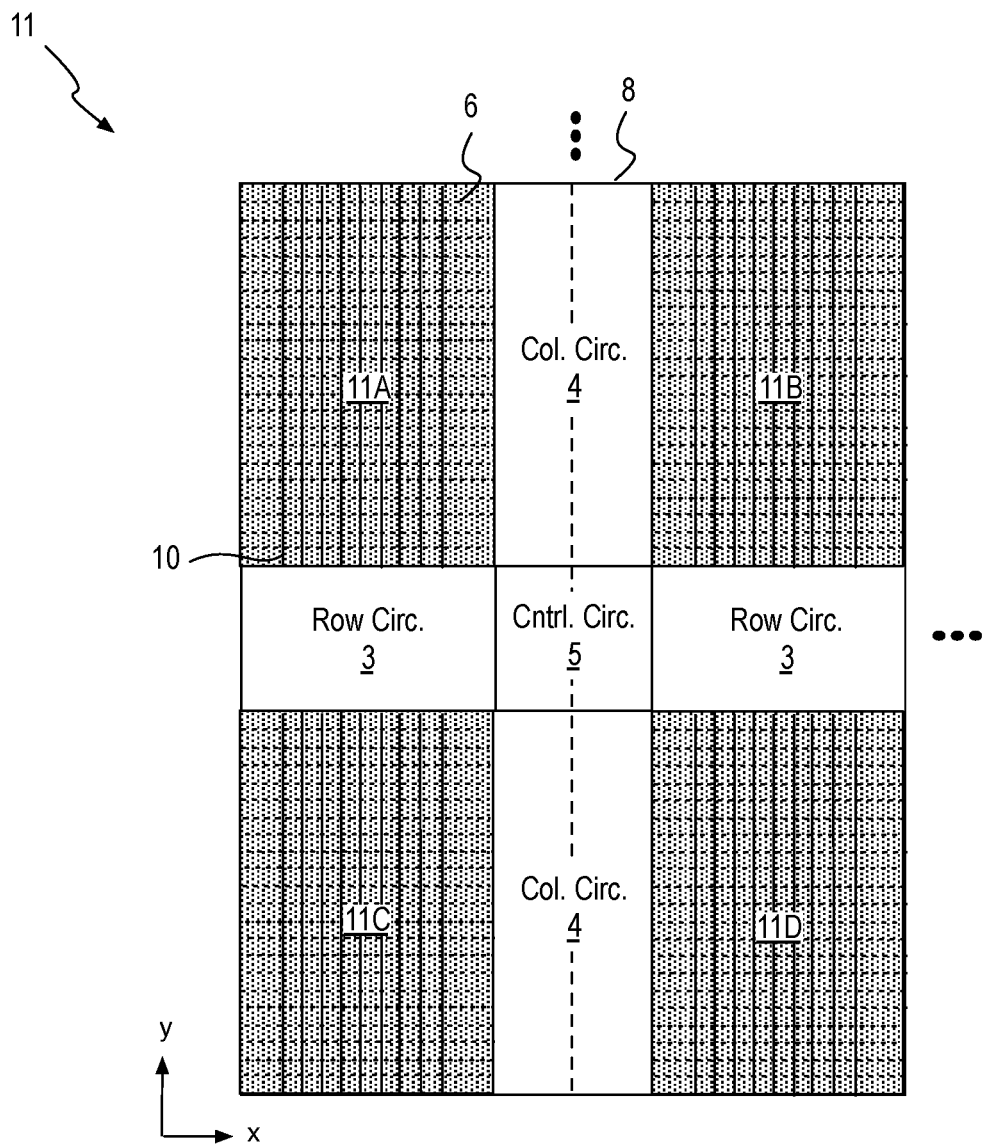
FIG. 1A illustrates a top-down plan view of a conventional memory device suitable for eDRAM applications.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Memory devices comprising one or more arrays in which individual memory cells include a thin film select transistor and a capacitor (1TFT-1C) are described below. A 2D array of metal-insulator-metal capacitors may be fabricated over an array of the TFTs. Adjacent memory cells coupled to a same bitline may employ a continuous stripe of thin film semiconductor material. An isolation transistor gate that is biased to remain off may provide electrical isolation between storage nodes of a bitline. Wordline resistance may be reduced with a wordline shunt fabricated in a metallization level and strapped to gate terminal traces of the TFTs at two or more points over a length of a wordline. The array of capacitors may occupy a footprint over a substrate. The TFTs providing wordline and bitline access to the capacitors may reside substantially within the footprint of the capacitor array. Peripheral column and row circuitry may employ FETs fabricated over a substrate substantially within the footprint of the capacitor array.

For some exemplary embodiments herein, the transistor of a 1T-1C storage cell is a TFT rather than a monocrystalline silicon-based transistor (e.g., MOSFET). Thin-film transistors (TFTs) are a class of field-effect transistors (FETs) in which the channel material is a deposited thin film rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon MOSFET fabrication technology. TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO), indium zinc oxide (IZO), and the like.

TFT-based eDRAM embodiments described herein may advance MCM or monolithic integration of DRAM. TFT-based eDRAM embodiments described herein may reduce the footprint of an eDRAM device by moving the select transistors off the substrate so as to be vertically integrated with the capacitors. The capacitors may be fabricated within metal interconnect levels while the TFTs are fabricated within other interconnect levels. TFT-based eDRAM embodiments described herein may also reduce the footprint of an eDRAM device by moving peripheral circuitry to a region of a monocrystalline device layer (e.g., silicon substrate) at least partially within a footprint of the storage capacitors.

Figure 1B:
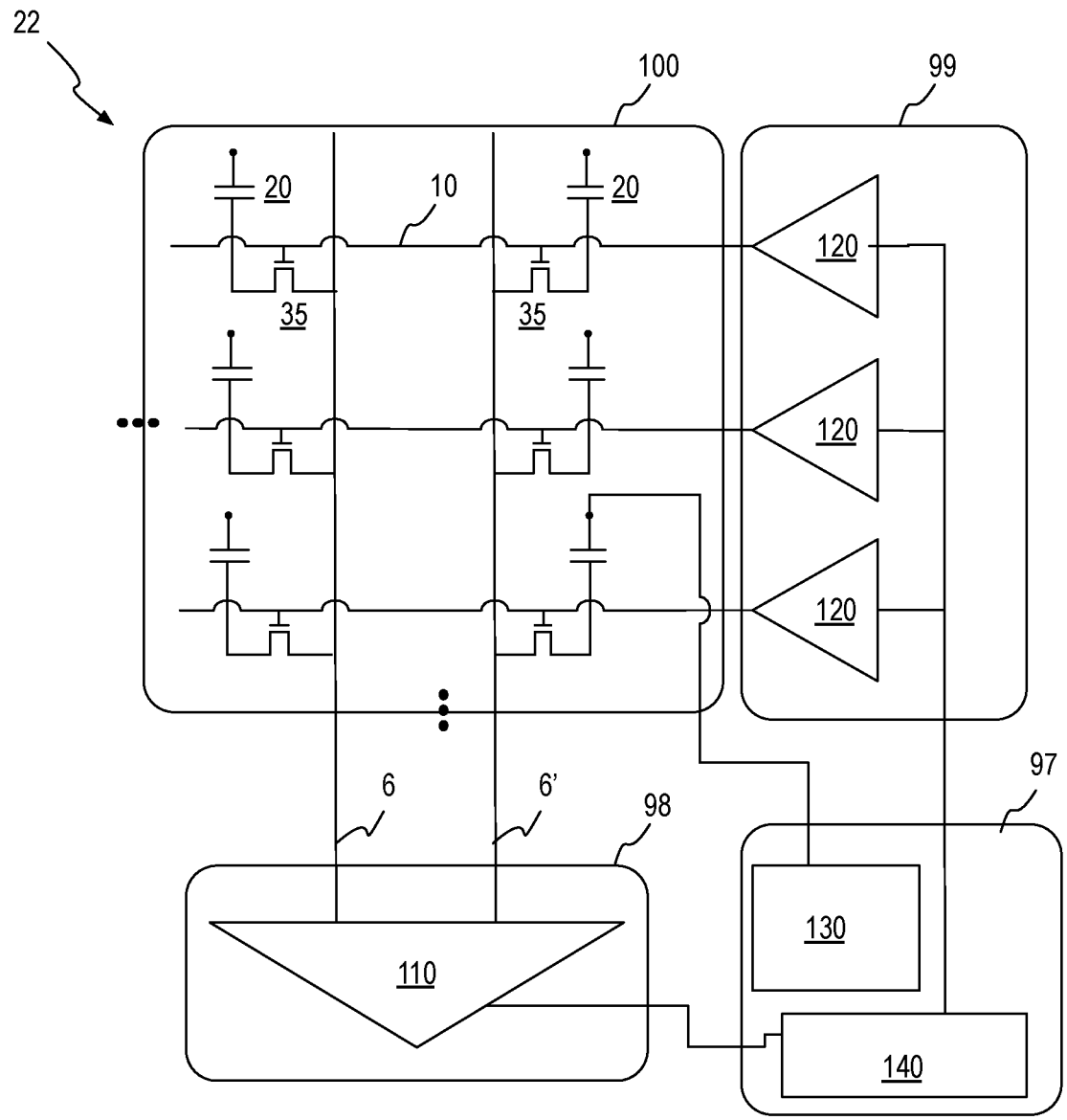
FIG. 1B is a schematic illustrating a TFT memory device structure, in accordance with some embodiments.

FIG. 1B is a schematic illustrating a TFT memory device 22, in accordance with some embodiments. In this macroview, a memory array 100 includes a 2D array of storage capacitors 20 networked with conductive traces including bitlines 6 and 6' (reference), as well as wordlines 10. Memory array 100 further includes a select transistor 35 electrically coupled to each storage capacitor 20. Select transistor 35 is advantageously a TFT. In some embodiments, memory array 100 is fabricated in the BEOL interconnect levels of an IC chip. Hence, all of capacitors 20, bitlines 6, 6', wordlines 10, and select transistors 35 are fabricated within, and/or between, various interconnect metallization levels. In further embodiments, peripheral memory circuitry including at least one of column circuitry 98 and row circuitry 99, is fabricated in a device level that falls within at least some of the footprint of memory array 100. For example, bitlines 6, 6' may be electrically coupled to a sense amplifier 610 employing MOSFETs fabricated in a region of a monocrystalline semiconductor device layer (e.g., silicon substrate) that is at least partially underlying memory array 100. In further embodiments, wordlines 10 are electrically coupled to wordline drivers 620 that employ MOSFETs fabricated in a region of a monocrystalline semiconductor device layer (e.g., silicon substrate) that is at least partially underlying memory array 100.

In some embodiments, peripheral memory circuitry further includes control circuitry 97. One or more of column circuitry 98, and/or row circuitry 99, and/or memory array 100 may be electrically coupled to control circuitry 97. Control circuitry 97 may also be fabricated in a device level the falls within the footprint of memory array 100. Control circuitry 97 may, for example, also employ MOSFETs fabricated in a region of a monocrystalline semiconductor device layer (e.g., silicon substrate) that is at least partially underlying memory array 100. Control circuitry 97 may include, for example, various voltage biasing circuits, such as capacitor bias circuitry 130. Control circuitry 97 may include, for example, various memory management circuitry, such as control logic 140 communicatively coupled into column circuitry 98 and row circuitry 99 so as to permit coordinated operation of sense amplifier 110 and wordline driver 120.

Figure 1C:
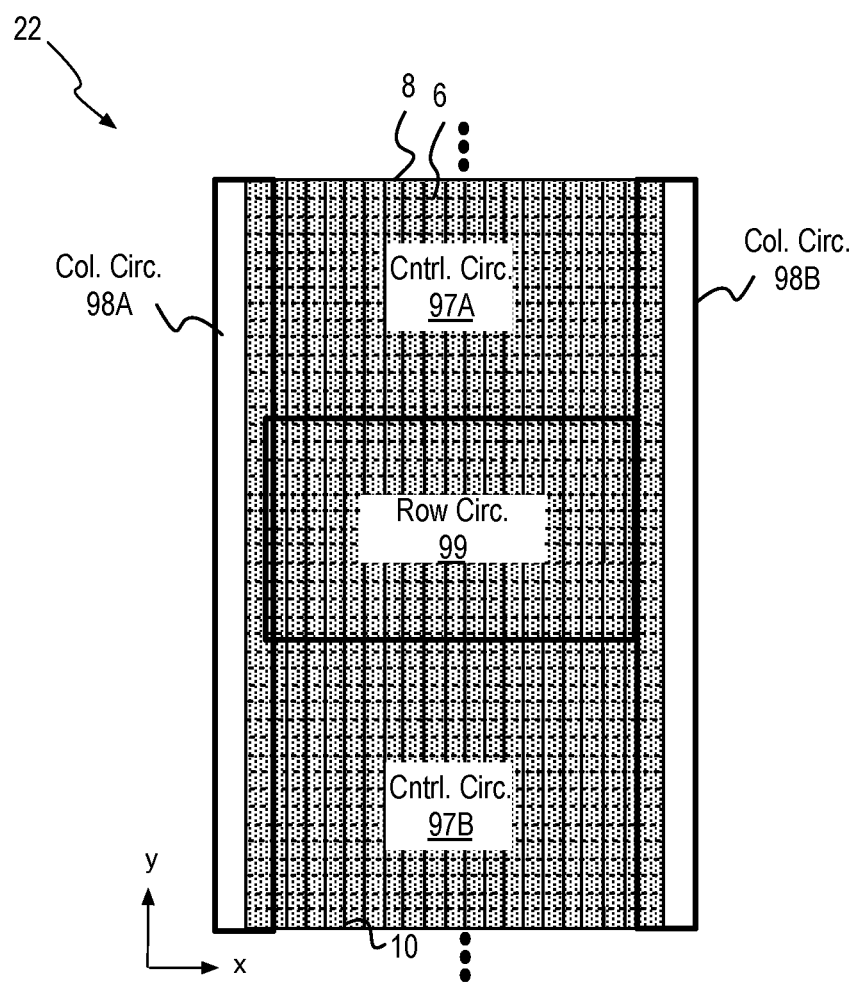
FIG. 1C illustrates a top-down plan view of a memory device structure, in accordance with some exemplary embodiments of the memory device structure illustrated in FIG. 1B.

FIG. 1C illustrates a top-down plan view of memory device 22, in accordance with some exemplary embodiments. Memory device 22 may have any storage capacity (i.e., any number of bit cells) and one or more memory device 22 may be fabricated on a single IC chip. In some embodiments, for example, memory device 22 includes between 256 and 1024 wordlines and between 1024 and 4096 bitlines. For any memory device storage capacity, memory device 22 may enable a memory density improvement by vertically integrating the peripheral circuitry at least partially within memory array footprint 8. The compactness of memory device 22 is apparent when compared to that of memory device 11 (FIG. 1A).

In FIG. 1C, the filled field regions demark the 2D array of storage capacitors with each capacitor in the array being a MIM capacitor, for example. Cell selection circuitry including a plurality of bitlines 6 extending in a first direction (e.g., x-dimension), and a plurality of wordlines 10 extending in a second, orthogonal direction (e.g., y-dimension). TFT selection transistors are fabricated in a 2D array employing an amorphous or polycrystalline semiconductor device layer within footprint 8. Peripheral circuitry implemented with MOS technology employing FETs is vertically integrated so as to at least partially occupy memory array footprint 8. To emphasize the vertical integration, portions of the peripheral circuitry are demarked by heavy outlines in FIG. 1C. In the example shown, column circuitry includes first column circuitry 98A located at a first edge of the memory array and second column circuitry 98B located at the opposite edge of the memory array. At least a portion of one or more of column circuitry 98A, 98B may reside within memory array footprint 8. In the embodiment illustrated, a first portion of column circuitry 98A is located within footprint 8, while a second portion of column circuitry 98A is located beyond memory array footprint 8 (unshaded in FIG. 1C). A first portion of column circuitry 98B is likewise located within memory array footprint 8, while second portion of column circuitry 98B is also located beyond footprint 8. As shown, column circuitry 98A and 98B extend the length of the memory array so as to be communicatively coupled to the plurality of bitlines 6. In some embodiments, column circuitry 98A is electrically coupled to a first subset of bitlines 6 (e.g., odd numbered columns of the array, or left-side columns of the array) while column circuitry 98B is electrically coupled to a second subset of bitlines 6 (e.g., even numbered columns, or right-side).

As further illustrated in FIG. 1C, row circuitry 99 is located between column circuitry 98A and column circuitry 98B. Row circuitry 99 resides completely within memory array footprint 8. Row circuitry 99 may extend over the length of the memory array so as to be communicatively coupled to the plurality of wordlines 10. Control circuitry may then be located along one or more edges of row circuitry 99. In the illustrated example, the control circuitry includes first control circuitry 97A located at a first (top) edge of the memory array and second control circuitry 97B located at the opposite (bottom) edge of the memory array. At least a portion of one or more of control circuitry 97A, 97B may reside within memory array footprint 8. In the embodiment illustrated, both control circuitry 97A and control circuitry 97B reside completely within memory array footprint 8. According to the illustrated layout, control circuitry 97A may be advantageously electrically coupled to adjacent (e.g., top) portions of each of column circuitry 98A and column circuitry 98B. Likewise, control circuitry 97B may be advantageously coupled to adjacent (bottom) portions of each of column circuitry 98A and column circuitry 98B. Control circuitry 97A and control circuitry 97B may each be further coupled to portions of row circuitry 99. One or more of control circuitry 97A and control circuitry 97B may also be coupled into the memory array, for example in a manner operable to provide a reference potential to a plate of various ones of the storage capacitors.

Figure 2:
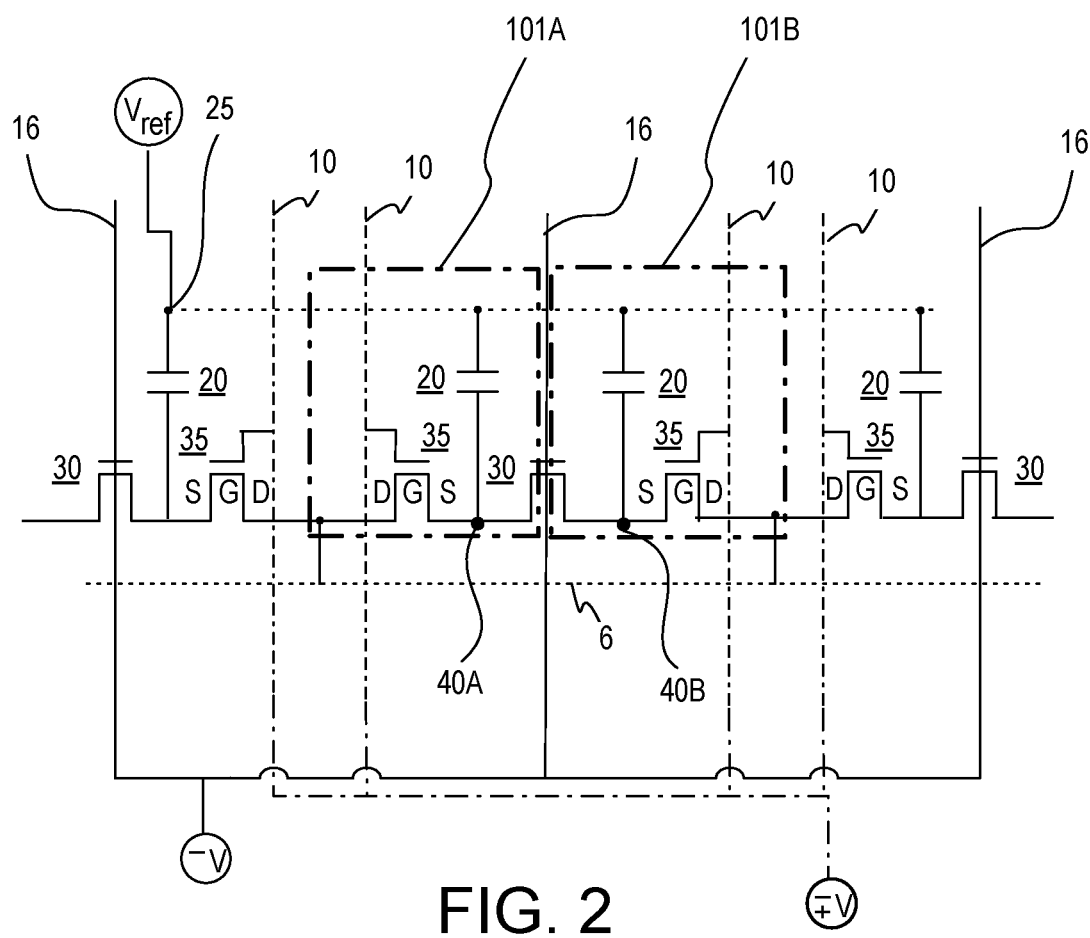
FIG. 2 is a schematic of a memory device structure, in accordance with some embodiments of the memory device structure illustrated in FIG. 1B.

A memory device architecture employing TFTs in the memory array enables vertical integration of the peripheral circuitry. A concomitant gain in memory density is then possible if the use of TFTs in the memory array does not significantly increase the memory array footprint beyond that of an array employing FETs. As such, a high-density TFT array architecture is important to realizing significant gains in memory density. FIG. 2 is a schematic of a TFT memory device structure, in accordance with some embodiments of the memory device structure illustrated in FIG. 1B.

TFT memory device structure illustrated in FIG. 2 may, for example, result in a high density memory array well-suited to a vertically integrated architecture, such as that illustrated in FIG. 1C.

In reference to FIG. 2, an integrated circuit memory device in accordance with some embodiments includes a plurality of memory cells that are electrically isolated from each, at least in part, by an isolation transistor. In FIG. 2, for example, an isolation transistor 30 provides electrical isolation between a memory cell 101A (denoted in dot-dashed line) and an adjacent memory cell 101B (denoted in dot-dashed line). As further shown, memory cell 101A includes a storage capacitor 20 having a terminal electrically coupled to semiconductor terminal a select transistor 35. Memory cell 101B also includes a storage capacitor 20 coupled a select transistor 35. In the illustrative embodiment, storage capacitors 20 have a first terminal connected in parallel to a shared circuit node 25. During memory device operation, circuit node 25 may be maintained at a reference voltage potential (e.g., ground). Storage capacitor 20 for cell 101A has a second terminal connected to another circuit node (e.g., storage node 40A). For cell 101B, storage capacitor 20 likewise has a second terminal connected to another circuit node (e.g., storage node 40B). The storage nodes 40A, 40B are further connected to the semiconductor source terminal of corresponding select transistors 35. Select transistors 35 have a semiconductor drain terminal electrically connected to bitline 6. The gate terminal of select transistors 35 is connected to respective wordlines 10. Hence, adjacent memory cells 101A and 101B are electrically coupled to one bitline 6 with their respective select transistor 35 further coupled to separate wordlines 10.

Wordlines 10 are connected to corresponding wordline drivers (or a similar voltage source) operable to bias the wordlines between a voltage sufficient to turn off a select transistor and a voltage sufficient to turn on a select transistor. For example, as shown in FIG. 2, wordlines 10 are coupled to a wordline driver operable to bias the wordline between a negative voltage (e.g., between 0V and −0.5V) sufficient to turn off an n-type transistor, and a positive voltage (e.g., between 0.5V and 2V) sufficient to turn on an n-type transistor.

Memory cells 101A and 101B therefore may be considered 1T-1C cells isolated by an intervening isolation transistor. As described further below, because the source and drain semiconductor of the isolation transistor is integrated with the semiconductor terminals of the select transistor, the isolation transistor needs no external source and drain contacts, leaving only a gate terminal to be externally routed. As such, memory cells 101A and 101B may also be considered 1T-1C cells isolated by an intervening isolation gate. Memory cells 101A and 101B may be replicated over any given bitline length. As further shown in FIG. 2, for example, select transistors 35 of a third and fourth bit cell have a gate terminal coupled to another wordline 10, their semiconductor drain terminals connected to bitline 6, and their semiconductor source terminals connected to a corresponding capacitor 20. Storage nodes of the third and fourth cells are each further coupled to another isolation transistor 30. With this architecture, a bitline is coupled to drains of pairs of select transistors 35 that have their source terminals isolated from those of adjacent cells by the intervening isolation transistor 30.

In accordance with some embodiments, the storage nodes of adjacent memory cells sharing a same bitline are electrically connected to a semiconductor terminal (e.g., a source or drain terminal) of an isolation transistor. In FIG. 2, for example, one source or drain semiconductor terminal of isolation transistor 30 is coupled to storage node 40A while the other source or drain semiconductor terminal of isolation transistor 30 is coupled to storage node 40B. Storage node 40A is therefore electrically coupled to storage node 40B through isolation transistor 30. The gate terminal of isolation transistor 30 is connected to an isolation wordline 16, which although structurally the same as wordlines 10, need only be operable to maintain isolation transistor 30 in an off-state (i.e., approximating an open circuit between storage nodes 40A and 40B). For example, as shown in FIG. 2, isolation wordlines 16 are coupled to a wordline driver (or a similar voltage source) operable to bias the isolation wordline to a negative voltage (e.g., between 0V and −0.5V) sufficient to keep an n-type transistor in an off-state.

As noted above, select transistor 35 may be implemented as a TFT. Isolation transistor 30 may also be implemented as a TFT. In some such embodiments, isolation transistor 30 is substantially identical to select transistor 34, and may be considered a "dummy" select transistor. A memory device architecture including such an isolation transistor may facilitate manufacturing of a memory array such that the TFT array density can be increased. Although the addition of the isolation transistor to the memory circuit may appear contrary to a goal of a high memory array density, at least some of the advantages are highlighted below.

Figure 3:
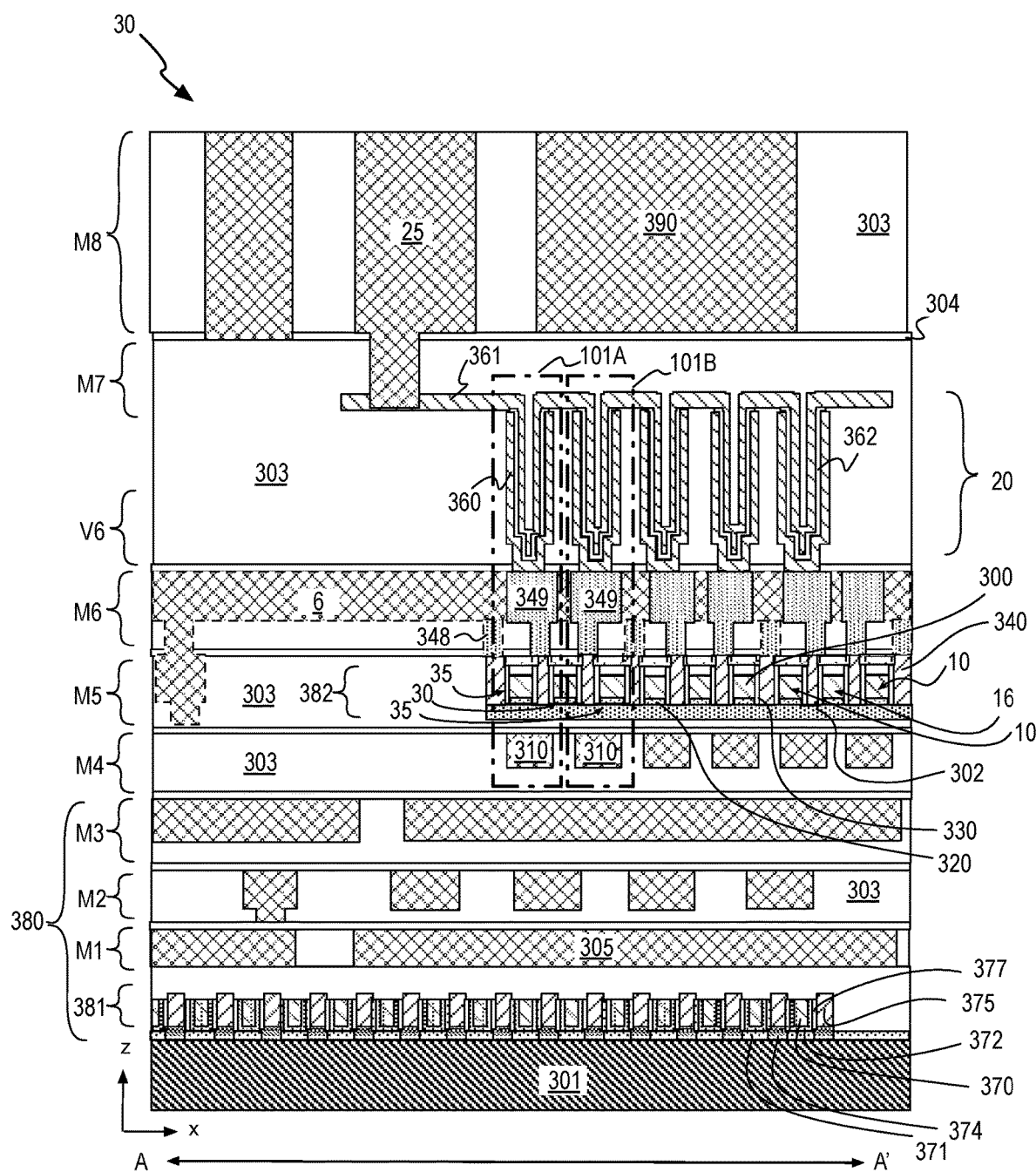
FIG. 3 illustrates a cross-sectional side view of a memory device structure, in accordance with some exemplary embodiments of the structure illustrated in FIG. 1C.

In some embodiments, a plurality of TFTs is fabricated in a continuous layer of semiconductor material. In some exemplary memory devices, all TFTs coupled to a given bitline are fabricated in a continuous layer of semiconductor material. In other words, select transistors that are coupled to one bitline have semiconductor terminals that comprise portions of one continuous layer of semiconductor material. FIG. 3 illustrates a cross-sectional side view of a memory device structure 30, in accordance with some exemplary embodiments of the memory device 22 introduced in FIG. 1C. Memory device structure 30 includes an exemplary implementation of the memory array architecture introduced in FIG. 2.

Structure 30 represents a portion of a monolithic IC including peripheral circuitry 380 fabricated over and/or on a substrate 301. Peripheral circuitry 380 includes a plurality of MOSFETs 381 that employ a monocrystalline semiconductor for at least the channel semiconductor 371. Peripheral circuitry 380 may further include one or more levels of interconnect metallization 305 embedded in dielectric material layers 303, 304. In the exemplary embodiment illustrated, peripheral circuitry 380 includes metal-one (M1), metal-two (M2) and metal-three (M3) interconnect metallization levels.

A plurality of TFTs 382 is located over peripheral circuitry 380. As shown, all TFTs 382 employ portions of semiconductor layer 302, which is advantageously a continuous amorphous or polycrystalline film extending across, and/or between, TFTs 382. Memory cells 101A and 101B are denoted by dot-dashed line in FIG. 3. At the interface of cells 101A and 101B, isolation transistor 30 separates select transistors 35. TFTs 382 comprise a three-transistor (select transistor 35, isolation transistor 30, select transistor 35) repeat unit replicated across continuous semiconductor layer 302. Individual ones of TFTs 382 include a gate terminal (electrode) 300 separated from semiconductor layer 302 by a gate dielectric 320. In the exemplary embodiment illustrated, TFTs 382 are "top-gate" devices with gate terminal 300 having been fabricated over semiconductor layer 302. A dielectric spacer 330 separates a sidewall of gate terminal 300 from semiconductor terminal contact metallization 340, which lands on source and drain regions of semiconductor layer 302. FIG. 3 illustrates the absence of contact metallization unique to isolation transistor 30. Contact metallization 340 lands on semiconductor layer 302 at four locations for the three transistors 35, 30, 35. Hence, the semiconductor terminals of isolation transistor 30 are the semiconductor terminals (e.g., source semiconductor) of select transistors 35. The footprint of isolation transistor 30 therefore amounts only to that of a dummy gate terminal 300 and surrounding dielectric spacer 330.

It should also be appreciated from FIG. 3 that dielectric spacer 330 may be self-aligned to gate terminal 300. Self-aligned techniques may include any unmasked anisotropic dielectric spacer etch process known to be suitable for the chosen dielectric composition. Contact metallization 340 backfills the region between adjacent dielectric spacers. Notably, with no bifurcation of semiconductor layer 302, TFTs 382 make a highly regular array that can be fabricated with only a few masks that establish initial grating patterns. Such 2D line patterns can be fabricated at nanometer dimensions (e.g., 10-20 nm features, or less). Self-aligned etch processes and/or damascene techniques, which are all highly scalable, may then be enlisted to generate TFTs 382 based on the initial grating pattern(s). In contrast, if one sought to introduce a cut through semiconductor layer 302 (e.g., at the location of the gate terminal of isolation transistor 30) more complex patterning would be needed (e.g., introducing at last one additional mask that would need to be accommodated with larger feature dimensions). Hence, introduction of isolation transistor 30 to the memory array architecture may advantageously increase TFT density and/or increase the associated fabrication process space.

While the memory device structures described herein are applicable to any thin film semiconductor material, including traditional group IV semiconductor materials such as silicon (Si), germanium (Ge), and SiGe alloys, TFT performance depends on the composition of the semiconductor employed as the transistor channel material. This may be particularly important where adjacent TFTs sharing a continuous layer of the semiconductor rely on an intervening isolation transistor. In some exemplary embodiments, TFTs 382 employ an oxide semiconductor for at least the channel material. An oxide semiconductor is a semiconducting oxide, or a semiconductor comprising oxygen. For such embodiments, the wide band gap oxide channel material offers low leakage. In such materials the minority carrier population is vanishingly small compared to that of materials such as silicon and germanium, making the TFT an exclusively majority carrier device. With essentially no minority carriers, majority-minority carrier recombination cannot generate significant off-state leakage current. Through low-leakage, TFTs 382 may enable higher retention rates at higher memory density and, as described further below, facilitate an advantageous TFT array structure.

Semiconducting properties vary with the oxide semiconductor composition and microstructure. An oxide semiconductor thin film can be amorphous (i.e., having no structural order), or polycrystalline (e.g., having micro-scale to nanoscale crystal grains). Hence, in addition to enabling a memory array to move off a monocyrstalline substrate, oxide semiconductor TFT-based embodiments described herein may include select transistors with a lower off-state leakage that further enable a reduction in capacitor size and increase TFT density.

Many oxide semiconductors have been studied, initially in the context of discrete rectifiers, and more recently in the context of TFTs for display applications. Examples include metal oxides with a transition metal (e.g., IUPAC group 4-10) or post-transition metal (e.g., IUPAC groups 11-15). In advantageous embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and mixtures thereof.

Semiconductor layer 302 may be a p-type, n-type, or intrinsic material. In exemplary embodiments, semiconductor layer 302 is n-type as a number of oxide semiconductors have been found to be capable of significant electron densities. Some oxide semiconductors have also been found to be capable of significant electron hole densities. Many oxide semiconductors have high defect density nearer the valence band, but display good n-type electrical properties. Some oxide semiconductors have high defect density in the conduction band, but display good p-type electrical properties. In some embodiments, semiconductor layer 302 comprises a tin oxide ($SnO_x$), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some other embodiments, semiconductor layer 302 comprises a zinc oxide ($ZnO_x$), such as Zn(II) oxide, or ZnO. In other embodiments, the zinc oxide is zinc dioxide ($ZnO_2$) or a mixture of ZnO and $ZnO_2$, where x may range between 1 and 2. In some other embodiments, semiconductor layer 302 comprises titanium oxide ($TiO_x$), or $SnO_x$. Exemplary oxide semiconductors that may have suitable p-type conductivity include copper oxide ($CuO_x$). In some $CuO_x$ embodiments, semiconductor layer 302 is Cu(I) oxide, or $Cu_2O$. In other embodiments, semiconductor layer 302 is Cu(II) oxide (CuO) or a mixture of CuO and $Cu_2O$, where x may range between 0.5 and 1. Still other exemplary oxide semiconductor compositions include $NiO_x$.

Oxide semiconductor conductivity type is a function of composition. Although not bound by theory, the basis for semi-conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor layer 302 or various portions thereof, may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H), and/or oxygen vacancies. Dopant levels in semiconductor layer 302 may be selected to arrive at an optimal threshold voltage associated with gating the oxide semiconductor within the channel and/or for lowest bulk and/or junction resistance within the source/drain region. In some embodiments where semiconductor layer 302 comprises $ZnO_x$, the dopants may include In and Ga. In some specific examples, semiconductor layer 302 is $InGaO_3(ZnO)_5$, often referred to simply as IGZO.

In some embodiments, TFT gate terminals comprise continuous traces extending between multiple bitlines. This gate trace continuity allows the TFT gate terminals to function as wordlines with in a memory array. With highly scaled gate trace geometries (e.g., with lateral gate lengths of 10-15 nm, or less), wordline resistance may become significant as the number of bitlines spanned by the TFT gate terminal trace increases. In accordance with some embodiments, a memory device wordline includes the transistor gate terminal traces and a wordline shunt. The wordline shunt may include one or more interconnect metallization trace extending in a direction parallel to a TFT gate terminal trace. The interconnect metallization trace may be implemented in a metallization level above or below the TFT. The interconnect metallization trace should be electrically coupled to a given TFT gate terminal trace in at least two points over the length of a wordline, thereby tying or strapping sections of the TFT gate terminal trace to the shunt trace. FIG. 3 further illustrates an exemplary wordline shunt trace 310 fabricated between TFTs 382 and peripheral circuitry 380. Wordline shunt trace 310 is fabricated in a metallization level (e.g., M4) immediately below the metallization level (e.g., M5) in which TFTs 382 reside. Wordline shunt trace 310 may for example be a predominantly Cu trace, or any other suitable BEOL metal.

Notably, wordline shunt trace 310 may have a lateral dimension and/or pitch larger than that of TFT gate terminal 300. Providing a shunt trace only for gate terminals of select transistors 35 may facilitate a larger shunt trace pitch. With the isolation gate terminal to be maintained at a predetermined bias voltage keeping isolation transistor 30 in an off-state during memory device operation, isolation wordline resistance poses little concern. As such, for each TFT repeat unit including a pair of select transistors 35 separated by an isolation transistor 30, only two wordline shunt traces 310 may be provided. The pitch of wordline shunt traces 310 may therefore be approximately 1.5 times that of the TFT gate terminal traces.

In some embodiments, a memory device bitline comprises an interconnect metallization trace within a metallization level above or below the TFTs. In some exemplary embodiments illustrated by FIG. 3, bitline 6 comprises an interconnect metallization trace within a metallization level (e.g., M6) immediately above the metallization level (e.g., M5) in which TFTs 382 reside. In FIG. 3, bitline 6 is illustrated in dashed line as an indication that bitline 6 is behind the plane of the cross-sectional view illustrated. Hence, the bitline 6 metallization trace is what might be visible if a portion of dielectric 303 flush with the plane of the cross-section was milled out (e.g., with a FIB during a deprocessing). As further shown, via 348 provides electrical connection between bitline 6 and contact metallization landing on semiconductor terminals (e.g. drain semiconductor) of select transistors 35. Source terminals of select transistors 35 are electrically connect through local interconnect metallization 349. Local interconnect metallization 349 is within the same metallization level (e.g., M6) as bitline 6. Local interconnect metallization 349 is adjacent to, but electrically insulated, from bitline 6.

In further reference to FIG. 3, an individual local interconnect metallization 349 electrically interconnects a first trench capacitor terminal 360 with a semiconductor terminal (e.g., source semiconductor) of select transistor 35. Capacitors 20 then further include a second terminal 361 that is separated from terminal 360 by an intervening dielectric material 362 having a suitable relative permittivity, etc. In the exemplary embodiment shown, terminal 361 is continuous across at least all capacitors 20 associated bitline 6. Terminal 361 may also be continuous across capacitors 20 associated multiple bitlines. Capacitor terminal 361 may then tie one side of all capacitors of a memory array to a common plate reference potential through circuit node 25, implemented for example with another metallization level (e.g., M8).

Any number of interconnect metallization levels may be employed to route circuit nodes of the memory array to the underlying peripheral circuitry. In the example shown in FIG. 3, the capacitor reference potential at circuit node 25 is routed down through five metallization levels (e.g., M8-M3) to be in electrical communication with one or more control circuit employing FETs 381. Likewise, bitline 6 is routed down through three metallization levels (e.g., M6-M3) to be in electrical communication with one or more sense amplifier employing FETs 381. Isolation wordline 16 and wordlines 10 (and/or wordline shunt traces 310) may also be routed down through one or more metallization levels (e.g., M4-M3) to be in electrical communication with one or more wordline driver employing FETs 381.

As further illustrated in FIG. 3, FETs 381 include a gate terminal 370 separated from channel semiconductor 371 by a gate dielectric 372. Channel semiconductor 371 separates semiconductor terminals 374 (source semiconductor and drain semiconductor). Contact metallization 375 lands on semiconductor terminals 374 and is separated from gate terminal 370 by an intervening dielectric spacer 377. Any materials and techniques known to be suitable for fabricating FETs may be employed for forming FETs 381. FETs 381 may be planar or non-planar devices, for example. In some advantageous embodiments, FETS 381 are finFETs. One or more semiconductor materials may be employed in FETs 381. As one example, FETs 381 employ a surface layer of a substantially monocyrstalline substrate 301. Substrate 301 may be any material known to be suitable for the fabrication of MOSFET (CMOS) circuitry, such as, but not limited to, group IV materials (e.g., silicon, germanium, and SiGe).

Figure 4A:
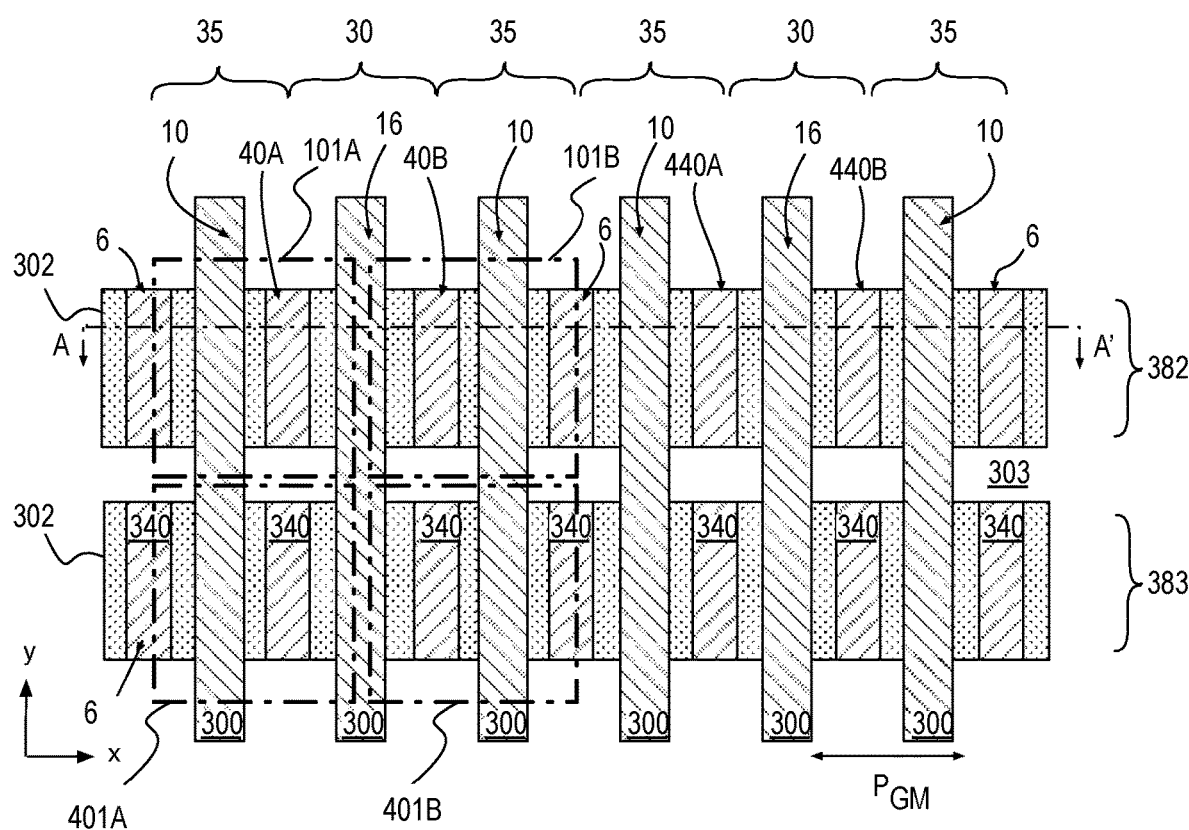
FIGS. 4A, 4B, and 4C illustrate a top-down plan view of the memory device structure illustrated in FIG. 3 as particular features are fabricated, in accordance with some embodiments.
Figure 4B:
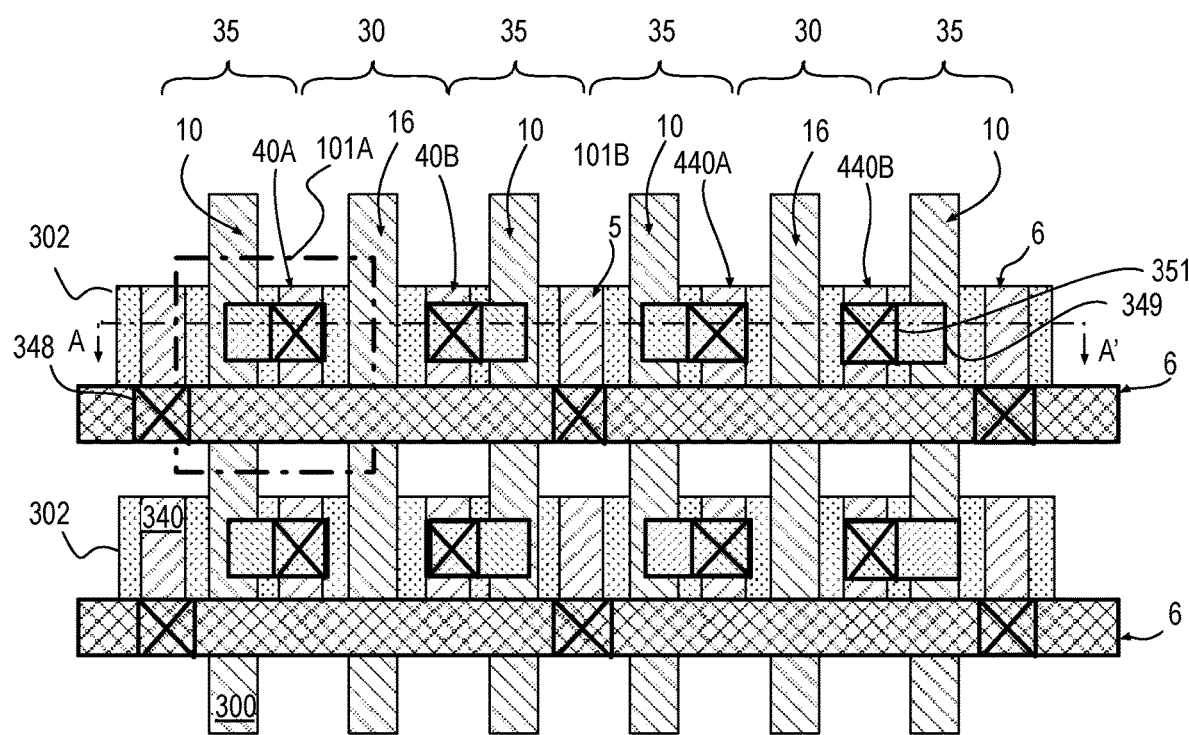
Figure 4C:
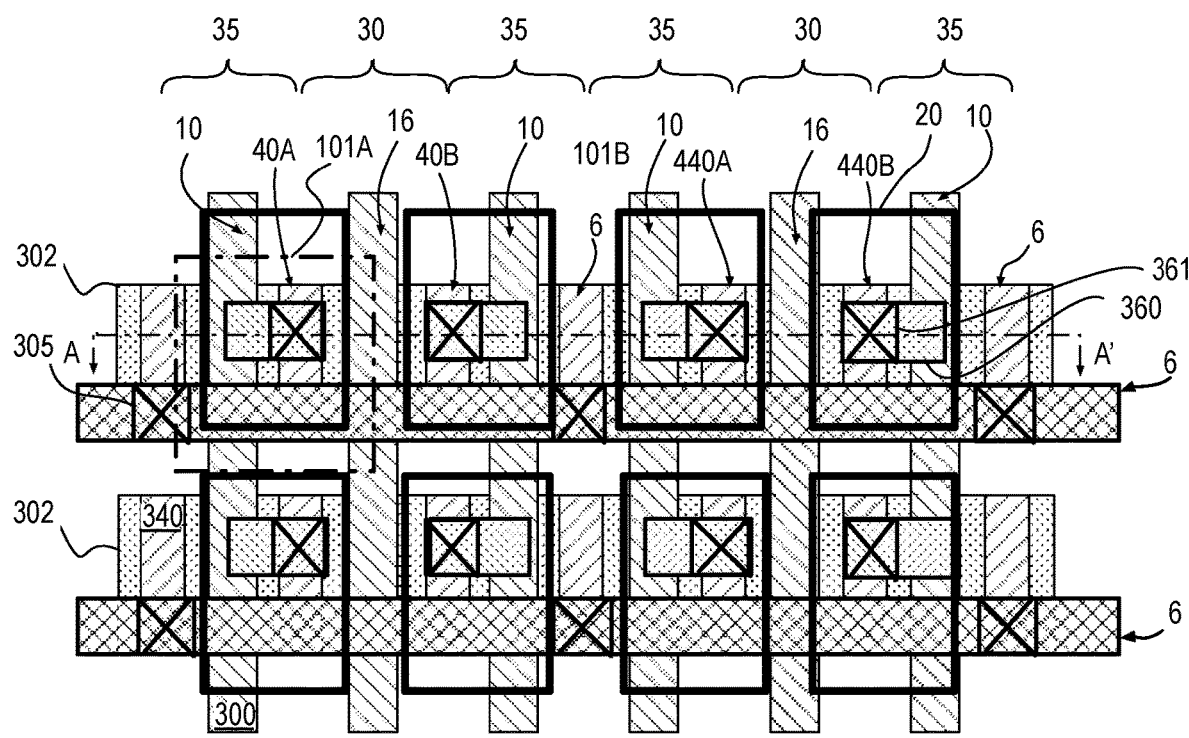

FIG. 4A-4C illustrate a top-down plan view of TFTs included in memory device structure 30 as particular features are fabricated, in accordance with some embodiments. Referring first to FIG. 4A, a thin film semiconductor layer 302 (e.g., an amorphous or polycrystalline semiconducting metal oxide) is deposited over dielectric 303 and patterned into parallel stripes. Each stripe of thin film semiconductor is employed by all TFTs electrically connected to a same bitline. In other words, may be nearly a one-to-one correspondence between the number of thin film semiconductor stripes and the number of bitlines in a memory array. In the example shown in FIG. 4A, TFTs 382 are fabricated on one continuous stripe of semiconductor layer 302. The A-A' line shown in FIG. 4A demarks a plane through TFTs 382 represented in FIG. 3. TFTs 383, associated with a different bitline, are fabricated on another stripe of semiconductor layer 302.

As further shown in FIG. 4A, gate terminals 300 comprise traces extending in a second direction (e.g., y-dimension), orthogonal to the longitudinal length of the semiconductor stripes. There is trace continuity between gate terminals 300 of different bitlines with each gate terminal crossing multiple stripes of semiconductor and extending over intervening dielectric 303.

Memory cells 101A and 101B are highlighted in FIG. 4A. Third and fourth memory cells 401A and 401B are also highlighted. As shown, the x-dimension of the memory cells is approximately 1.5 times the pitch of gate terminals 300 ($P_{GM}$). Isolation wordline 16 is continuous between bitlines, such that one isolation wordline 16 isolates memory cell 101A from 101B as well as memory cell 401A from 401B. Contact metallization 340 is to be coupled either to a bitline 6 associated with each semiconductor stripe, or to a storage node (e.g., 40A or 40B). A wordline repeat unit comprising a first wordline 10, an isolation wordline 16, and a second wordline 10 employing three adjacent gate terminals 300 is replicated over a length of each bitline. Hence, for any three adjacent gate terminals sharing a same bitline within a memory array, two will be operable as wordlines and one will be a dummy gate operable as an isolation wordline. Likewise, a transistor repeat unit comprising a first select transistor 35, an isolation transistor 30, and a second select transistor 35 is evident in the example shown in FIG. 4A. Hence, for any three adjacent TFTs sharing a same bitline, two will be select transistors and one will be an isolation transistor.

FIG. 4B illustrates the addition of bitline metallization and local interconnect metallization to the structure shown in FIG. 4A. As shown, bitlines 6 comprise metallization traces having longitudinal lengths extending parallel to the stripes of semiconductor layer 302. Bitline vias 348 couple to contact metallization 340 landing on first semiconductor terminals (e.g., drain semiconductor). Local interconnect metallization 349 couples to contact metallization 340 landing on second semiconductor terminals (e.g., source semiconductor). Bitline 6 is continuous across a plurality of wordlines 10 while local interconnect metallization 349 is separate for each memory cell.

FIG. 4C illustrates the addition of the MIM trench capacitors 20 to the structure shown in FIG. 4B. As shown, the pitch of capacitors 20 is approximately equal to that of the memory cells. In some embodiments, capacitor pitch is approximately 1.5 times the pitch of the gate terminal traces.

Figure 5A:
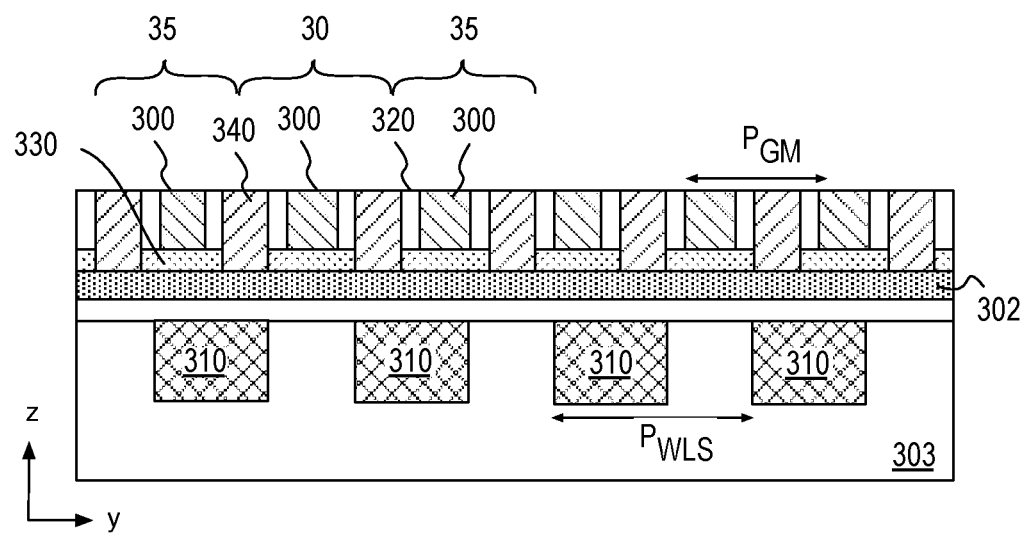
FIG. 5A illustrates an expanded cross-sectional side view of TFTs within a memory device structure, in accordance with some exemplary embodiments of the structure illustrated in FIG. 3.

FIG. 5A illustrates an expanded cross-sectional side view of top-gated TFTs within a memory device structure, in accordance with some exemplary embodiments. As shown, gate terminals 300 have a gate pitch $P_{GM}$, which may vary with fabrication technology node. As one example, gate pitch $P_{GM}$ may be between 30-100 nm. Gate terminals 300 may have any composition known to be suitable for controlling the channel conductivity. Gate terminals 300 may have any suitable work function and may include an elemental metal layer, a metal alloy layer, and/or laminate structure. In some embodiments, the gate terminals comprise a metal nitride, such as TiN. The gate terminals may also comprise Al (e.g., TiAlN). Other alloy constituents may also be employed, such as, but not limited to, C, Ta, W, Pt, and Sn. Gate dielectric 320 separates gate terminals 300 from semiconductor layer 302. While any gate dielectric materials known to be suitable for semiconductor layer 302 may be utilized, in some exemplary embodiments gate dielectric 320 includes at least one layer of a high-k dielectric material (e.g., having a bulk relative permittivity greater than 9). Exemplary high-k materials include electrically resistive metal oxides, such as, but not limited to, $Al_2O_3$, $HfO_2$, and $HfAlO_x$. Dielectric spacer 330 laterally separates gate terminals 300 from contact metallization 340. Dielectric spacer 330 may be any dielectric such as, but not limited to, silicon dioxide, silicon nitride, or silicon oxynitride, or any known low-k material.

Contact metallization 340 may have any composition known to provide a suitable contact to semiconductor layer 302. Contact metallization 340 may form a schottky or ohmic junction with an interface of semiconductor layer 302. Contact metallization 340 may include, for example, one or more metals or metallic compounds. In some embodiments, contact metallization 340 includes a metal nitride at the interface of (i.e., in direct contact with) semiconductor layer 302. Metal nitrides may offer good stability and do not readily oxidize. Exemplary metal nitrides include TiN, TaN, and WN. In other exemplary embodiments, contact metallization 340 includes a noble metal (e.g., Pt) at the interface of (i.e., in direct contact with) semiconductor layer 302.

Figure 5B:
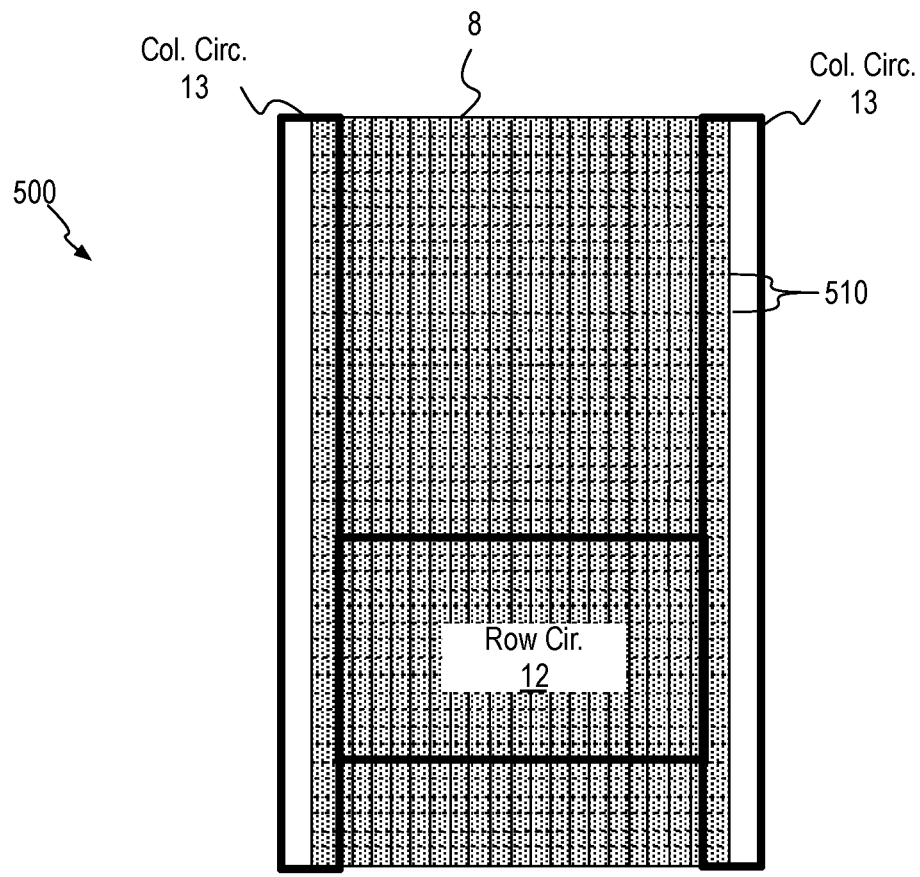
FIG. 5B illustrates a top-down plan view of a memory device structure, in accordance with some exemplary embodiments the memory device structure illustrated in FIG. 3.

Wordline shunt traces 310 are further illustrated in FIG. 5A. As shown, wordline shunt traces 310 comprise metallization traces having a pitch $P_{WLS}$. As noted above, shunt trace pitch $P_{WLS}$ may be approximately 1.5 times gate pitch $P_{GM}$. Although a wordline shunt trace 310 may be coupled to a corresponding gate terminal 300 in any manner, in some embodiments a wordline shunt trace 310 is coupled to a gate terminal trace through the same metallization level employed for the bitline (e.g., M6 in FIG. 3). Although the majority of a memory array may have the layout illustrated in FIG. 4B, a bitline location may be employed periodically within the array to interconnect the wordline shunt trace 310 to the gate terminal 300. FIG. 5B illustrates a top-down plan view of a memory device structure 500, in accordance with some embodiments. Memory device structure 500 is substantially as described above in the context of memory device 22 (FIG. 1C) with the addition of a bitline break 510. Bitline break 510 is located at a point of interconnection between a wordline shunt trace and an overlying gate terminal.

Figure 5C:
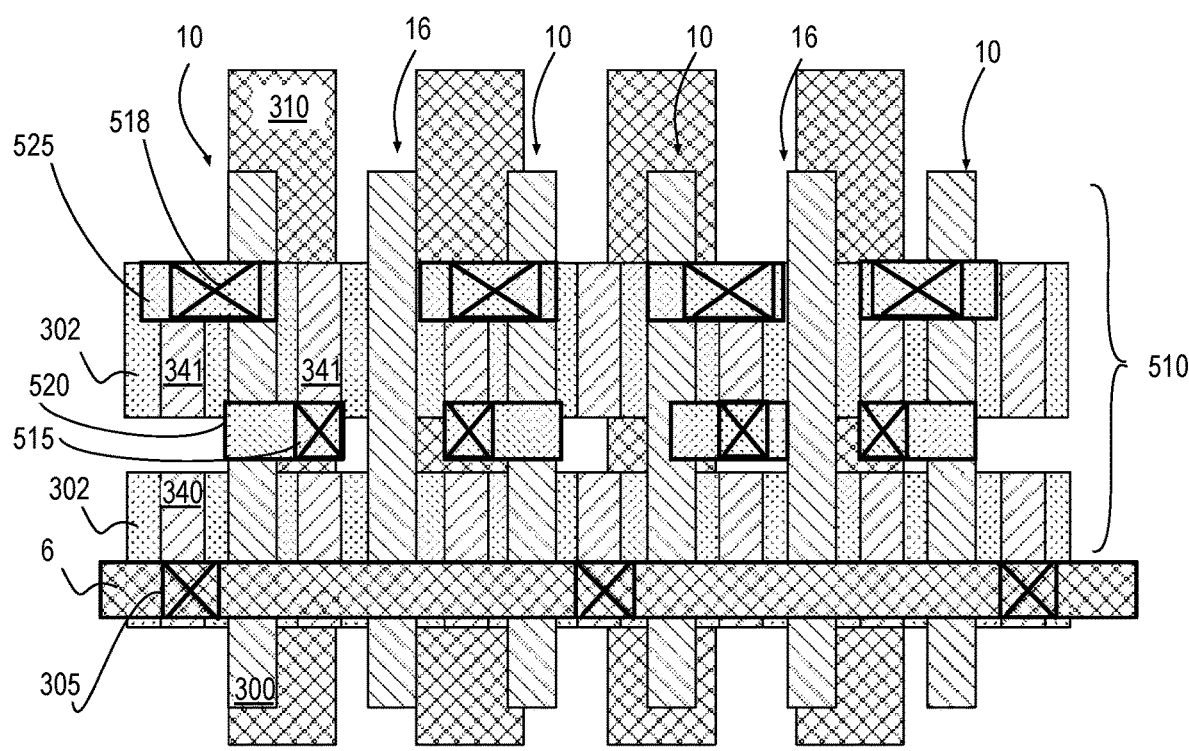
FIG. 5C illustrates a top-down plan view of a memory device structure, in accordance with some embodiments of the device structures illustrated in FIG. 3.

FIG. 5C illustrates a top-down plan view of a memory device structure, in accordance with some embodiments. The view in FIG. 5C is an expansion of the memory array around bitline break 510. As shown, in absence of a bitline trace, local interconnect metallizations 520 and 525 may be employed to provide electrical connection between a wordline shunt trace 310 and a gate terminal 300, respectively. In the example illustrated, a first via 515 passes between two adjacent semiconductor stripes, and may be fabricated with an etch process selective to dielectric 303 an non-selective to semiconductor layer 302. One or more vias 515 are landed on one or more contact metallizations 341. One or more vias 518 are landed on gate terminal (wordline) 300, and on one or more contact metallizations 341. Local interconnect metallizations 520 and 525 are then connected together through one or more contact metallizations 341. Alternatively, local interconnect metallizations 520 and 525 may be connected together at a higher interconnect metallization level, or the polygons of local interconnect metallizations 520 and 525 may be merged to strap the gate terminal trace and wordline shunt traces together at the bitline metallization level.

Figure 6:
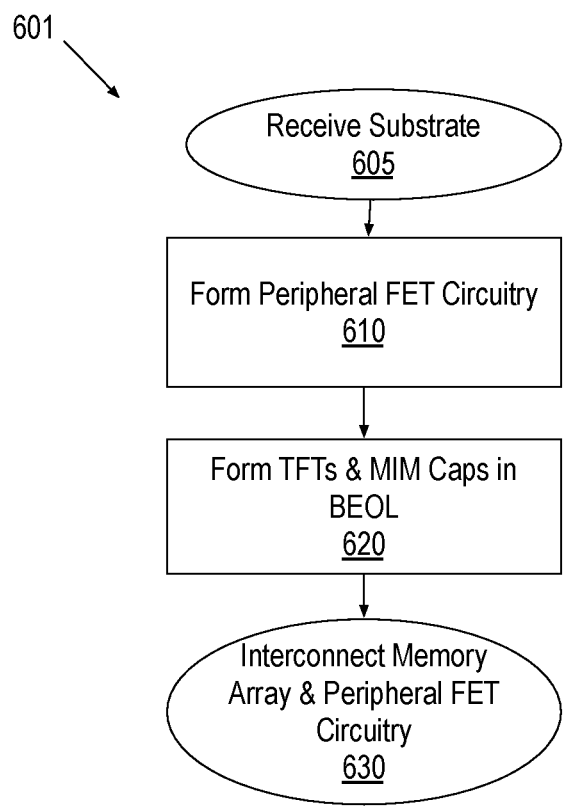
FIG. 6 is a flow diagram illustrating methods for fabricating a memory device, in accordance with some embodiments.

With certain structural features now described, the fabrication of such features is now described in further detail. FIG. 6 is a flow diagram illustrating methods 601 for fabricating a memory device, in accordance with some embodiments. Methods 601 begin at operation 605 where a substrate is received. The substrate advantageously includes a monocrystalline semiconductor layer, such as a silicon layer, upon which FETs may be formed. At operation 610, FETs are fabricated using any known technique and interconnected with BEOL metallization levels to form peripheral FET circuitry. In some examples, both n-type and p-type FETs are fabricated at operation 610 and interconnected into a CMOS peripheral circuit. At operation 620, TFTs and MIM capacitors are fabricated within BEOL metallization levels over the FET circuitry. In some exemplary embodiments, TFTs are fabricated in a metallization level over the peripheral circuit and the MIM capacitors are fabricated in a metallization level over the TFTs. The TFTs are interconnected to the MIM capacitors with traces fabricated at these same metallization levels to form a memory array. Methods 630 are then completed at operation 630 where one or more top metallization levels are fabricated to interconnect the memory array with the peripheral circuitry.

Figure 7:
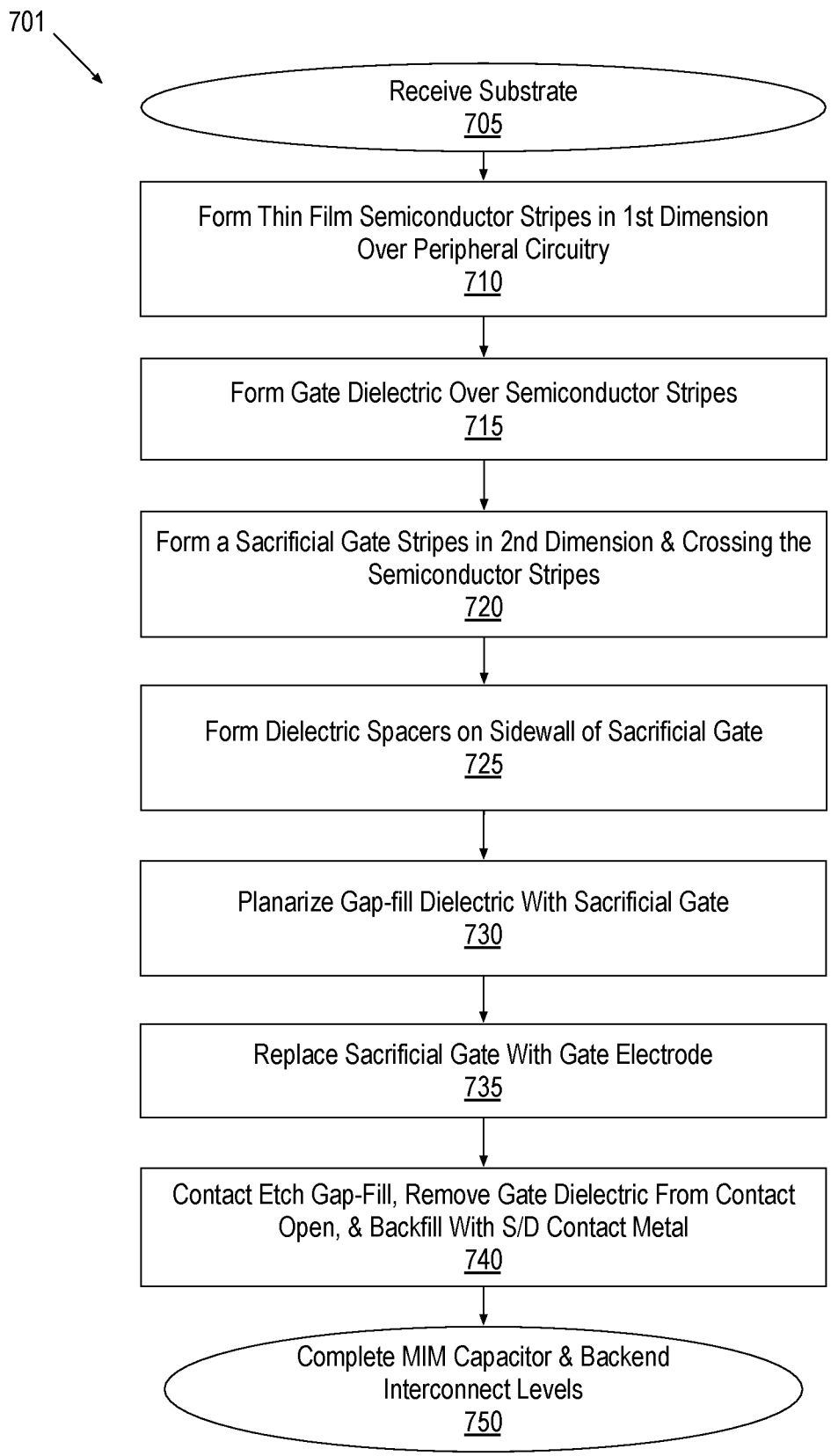
FIG. 7 is a flow diagram illustrating methods for fabricating a memory device, in accordance with some top-gate embodiments of the methods illustrated in FIG. 6.

FIG. 7 is a flow diagram illustrating methods 701 for fabricating a memory device, in accordance with some top-gate embodiments of methods 601. Methods 701 begin at operation 705 where a substrate including peripheral circuitry is received. The substrate received at operation 705 may have been processed upstream of methods 701, for example to fabricate FETs and one or more levels of BEOL interconnect metallization over the FETs.

At operation 710, semiconductor stripes are formed over a top dielectric layer of the peripheral circuitry. Operation 710 may entail any deposition process known to be suitable for the semiconductor composition and microstructure desired. For example, any of physical vapor deposition (PVD), chemical vapor deposition (CVD), e-beam deposition (EBD), or pulsed laser deposition (PLD) may be employed to deposit a thin film of semiconductor. In some embodiments where a layer of oxide semiconductor is deposited at operation 710, any of the materials described above may be deposited as a blanket layer over the substrate. The semiconductor layer may then be patterned, for example with any known lithographic mask patterning process followed by any semiconductor etch process known to be suitable for the semiconductor material. In some embodiments, for example, an anisotropic dry (plasma) etch is employed to pattern the semiconductor layer into a plurality of stripes forming a 2D grating pattern extending in a first (e.g., column) direction.

Methods 701 continue at operation 715 where a gate dielectric layer is blanket deposited over the semiconductor stripes. Operation 715 may entail any deposition process known to be suitable for the desired dielectric film. For example, any of CVD or atomic layer deposition (ALD) may be employed to deposit a thin film of a conventional or high-k gate dielectric layer. In some embodiments, the gate dielectric is deposited with a low temperature process (e.g., below 350° C.).

Alternatively, operations 710 and 715 may be merged with patterning of the stripes performed after both the semiconductor and gate dielectric materials are deposited. The resulting material stack may then be etched with multi-step etch process, for example.

Methods 701 continue at operation 720 where sacrificial gate stripes are formed over the gate dielectric layer. Any additive and/or subtractive processing techniques may be employed at operation 720 to form sacrificial gates. In some embodiments, a thin film of sacrificial material is deposited over the gate dielectric layer. The sacrificial material may have any composition that can be patterned with high fidelity and subsequently removed with adequate selectivity over the gate dielectric and/or surrounding dielectrics. In some embodiments, the sacrificial material is silicon (e.g., polycrystalline or amorphous). The film of sacrificial material may then be masked (e.g., with any photosensitive material), and the mask patterned (e.g., with any lithographic techniques known in the art) into a 2D grating pattern comprising stripes extending in a row direction, orthogonal to the column direction, and intersecting or crossing over the semiconductor stripes. The sacrificial material is then patterned by etching away the unmasked portion with any etch process suitable for the sacrificial material composition. The etching of the sacrificial material may stop on the gate dielectric layer, for example leaving at least a partial thickness of gate dielectric over other regions of the semiconductor layer. In some embodiments where the etching of the sacrificial material does not offer perfect selectivity over the gate dielectric, the thickness of gate dielectric remaining in regions unprotected by the sacrificial gate may have a thickness less (e.g., by 1-5 nm) than that of the gate dielectric under a sacrificial gate.

Methods 701 continue at operation 725 where dielectric spacers are formed along at least a sidewall of the sacrificial gate. Dielectric spacers may be advantageously formed with a self-aligned process that does not rely upon lithographic patterning techniques. In some embodiments, operation 725 entails a deposition of dielectric material and an anisotropic (blanket) etchback of the dielectric material. While the dielectric material deposited may be any known to be suitable for a gate spacer in the context of a FET, in some exemplary embodiments, the dielectric material has a relative permittivity below 5.0. One exemplary compound such as carbon-doped silicon (SiC) may have a dielectric constant above or below 5.0 depending on its specific composition, defect density etc. A compound such as carbon-doped silicon nitride (SiCN) may also have a k value below 5.0, again depending on its specific composition, etc. Some silicon oxynitride (SiON) compositions may also be suitable, depending on their nitrogen content and defect density, for example. Silicon dioxide (Sift), associated with a k value of 3.9, may also be considered a low-k dielectric in the context of gate spacers. Materials with a relative permittivity below that of silicon dioxide, such as, but not limited to, carbon-doped silicon oxide (SiOC(H)), polyimide, HSQ, or MSQ may also be deposited at operation 725. However, since these materials may be very sensitive to subsequent processing, there use may further entail the deposition of a multi-layered stack, a top layer of which is a higher-k material to protect the an underlayer of sensitive low-k material. Following dielectric material deposition, any anisotropic etch, such as an anisotropic dry (plasma) etch may be performed to etch through the dielectric material layer(s) with resultant spacers remaining only along topography of sufficient height. The vertical height of the sacrificial gate may be increased as needed with the addition of a dielectric capping layer, to help retain spacers along the sacrificial gate.

Methods 701 continue at operation 730 where the structures formed thus far are planarized with a gap-fill dielectric. Any dielectric material known to have suitable gap filling properties may be employed at operation 730. In some exemplary embodiments, the dielectric material is a low-k material deposited by a gap-filling technique, such as, but not limited to, sub-atmospheric flowable oxide deposition techniques and/or spin-on application techniques. Some exemplary flowable dielectrics are polymers that are subsequently treated with one or more chemical processes and/or thermal processes to cure and densify the dielectric material. If needed, a planarization process (e.g., chemical-mechanical polish) may remove any deposition overburden to planarize a top surface of the sacrificial gate material with a top surface of the surrounding dielectric.

Methods 701 continue at operation 735 where the sacrificial gate material is replaced with gate electrode/terminal material. Gate replacement may entail any subtractive and/or additive processing techniques known in the art. In some embodiments, the sacrificial gate material is removed (etched) selectively to the underlying gate dielectric. In some embodiments, the sacrificial gate material is removed (etched) selectively to the adjacent dielectric spacers. In some embodiments, the sacrificial gate material is removed (etched) selectively to the gap-fill dielectric. Removal of the sacrificial gate material may be by wet chemical or dry (plasma) processing, for example. Gate terminal material may then be backfilled into the resulting openings using any damascene technique(s). In some embodiments, a gate electrode material is deposited using any technique suitable for the material. Deposition overburden may be removed by CMP to planarize a top surface of the gate electrode material with that of the surrounding dielectric(s).

Methods 701 continue at operation 740 where the gap-fill dielectric is patterned to expose semiconductor terminal regions (source and drains) within each of the semiconductor stripes. Any gate dielectric remaining within the terminal openings may be removed at this time. Upon exposing the semiconductor layer, the contact openings are then backfilled with contact metallization. The backfilling of one or more contact materials may be by any damascene technique(s), for example. Deposition overburden may again be removed by CMP to planarize a top surface of the contact material with that of surrounding dielectric(s) and/or gate terminal.

Any additive and/or subtractive processing techniques may be employed at operation 740. In some embodiments, a mask (e.g., of any photosensitive material) is applied, the mask is patterned (e.g., with any lithographic techniques known in the art), and the unmasked gap-fill dielectric is etched. The etch process may be any known in the art to be suitable for the particular dielectric composition. In some embodiments, the gap-fill dielectric is etched at operation 740 with an etch process that is sufficiently selective to the dielectric spacer so as to self-align the contact openings to an outer edge of the dielectric spacer. If the gap-fill dielectric is removed with an etch process that is also selective to the gate dielectric, a subsequent etch of the gate dielectric may be performed with any etch process that will retain the dielectric spacer. Such a self-aligned contact (SAC) etch may provide good control over the length of the TFT channel and achieve a high memory array density.

At operation 750, the MIM trench capacitor processing is performed according to any known technique. Any remaining BEOL metallization levels may then be completed to render the memory device is substantially complete.

Figure 8:
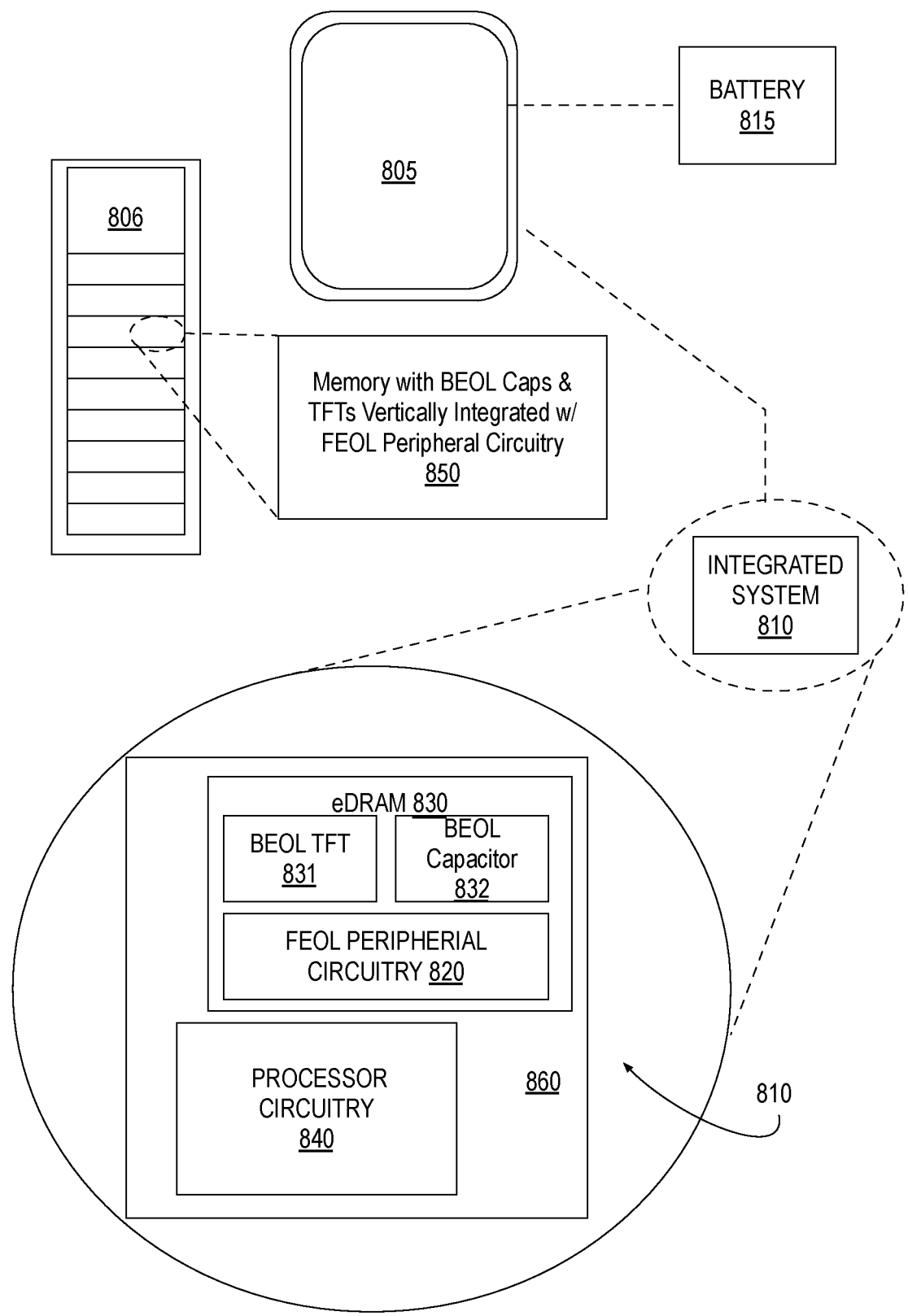
FIG. 8 illustrates a mobile computing platform and a data server machine including a memory device with BEOL capacitors and TFTs vertically integrated with FEOL peripheral circuitry, in accordance with some embodiments.

FIG. 8 illustrates a mobile computing platform and a data server machine employing a memory device 850 including BEOL TFTs, for example as described elsewhere herein. The server machine 806 may be any commercial server, for example including any number of high-performance computing platforms disposed within a rack and networked together for electronic data processing, which in the exemplary embodiment includes a packaged monolithic or MCM IC-eDRAM device. The mobile computing platform 805 may be any portable device configured for each of electronic data display, electronic data processing, wireless electronic data transmission, or the like. For example, the mobile computing platform 805 may be any of a tablet, a smart phone, laptop computer, etc., and may include a display screen (e.g., a capacitive, inductive, resistive, or optical touchscreen), a chip-level or package-level integrated system 810, and a battery 815.

Disposed within the integrated system 810, a substrate 860 includes an eDRAM 830 and processor circuitry 840 (e.g., a microprocessor, a multi-core microprocessor, graphics processor, or the like). eDRAM 830 includes 1C-1TFT cells, with each cell including a BEOL TFT 831 and a BEOL capacitor 832, for example as described elsewhere herein. For monolithic embodiments, substrate 860 is a semiconductor chip. For MCM embodiments, substrate 860 may be any package substrate, or an interposer. Processor circuitry 840, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
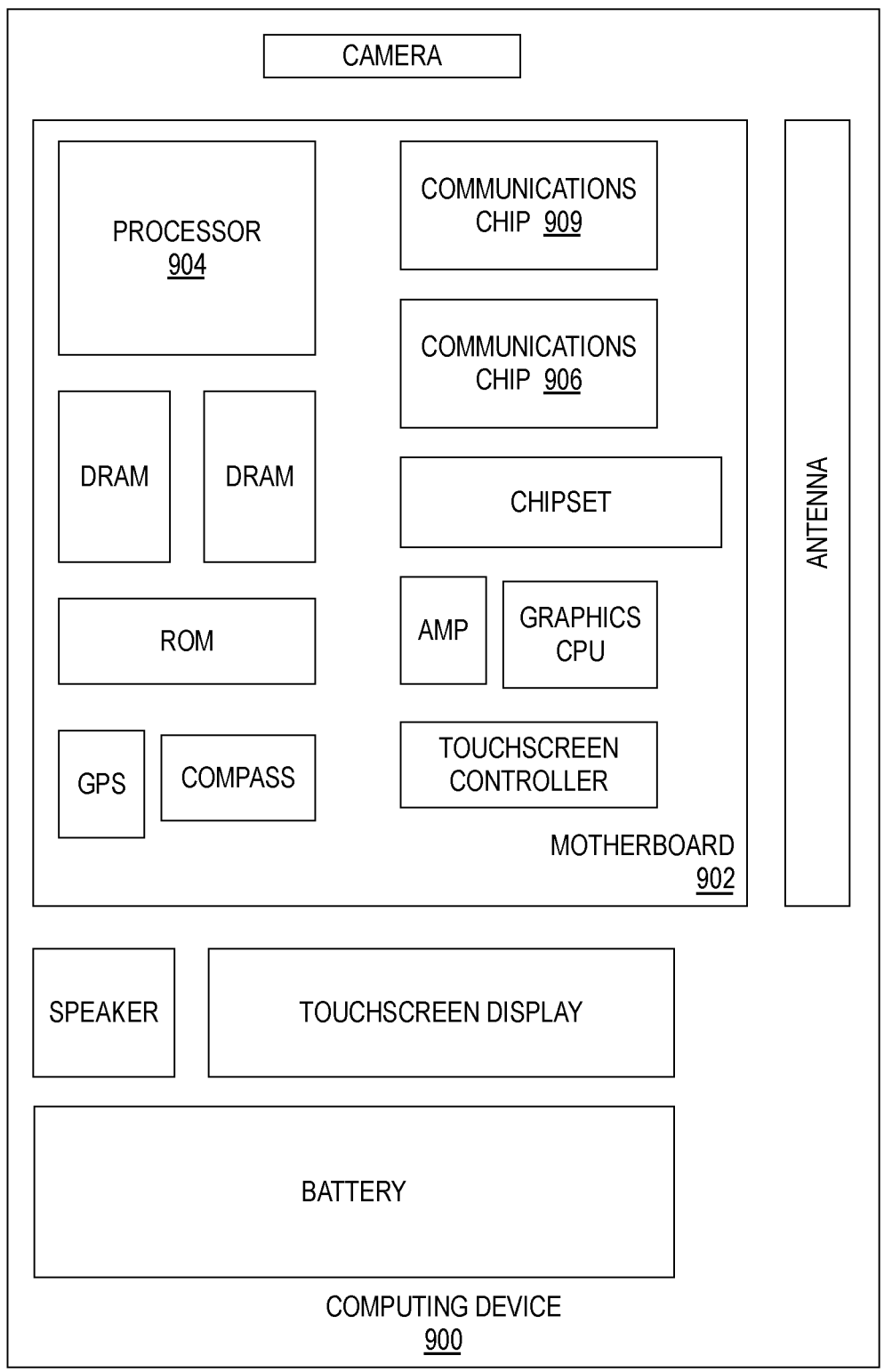
FIG. 9 is a functional block diagram of an electronic computing device, in accordance with some embodiments.

FIG. 9 is a functional block diagram of an electronic computing device, in accordance with some embodiments. Computing device 900 may be found inside platform 805 or server machine 806, for example. Device 900 further includes a motherboard 902 hosting a number of components, such as, but not limited to, a processor 904 (e.g., an applications processor). Processor 904 may be physically and/or electrically coupled to motherboard 902. In some examples, processor 904 includes an integrated circuit die packaged within the processor 904. In general, the term "processor" or "microprocessor" may refer to any device or portion of a device that processes electronic data from registers and/or memory to transform that electronic data into other electronic data that may be further stored in registers and/or memory.

In various examples, one or more communication chips 906 may also be physically and/or electrically coupled to the motherboard 902. In further implementations, communication chips 906 may be part of processor 904. Depending on its applications, computing device 900 may include other components that may or may not be physically and electrically coupled to motherboard 902, and/or packaged with processor 904, and/or monolithically integrated with processor 904. These other components include, but are not limited to, volatile memory (e.g., eDRAM, which may further incorporate at least one oxide semiconductor TFT structure, for example as described elsewhere herein), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 906 may enable wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 906 may implement any of a number of wireless standards or protocols, including but not limited to those described elsewhere herein. As discussed, computing device 900 may include a plurality of communication chips 906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first examples, an integrated circuit memory device, comprises a first capacitor having a terminal electrically coupled to a first semiconductor terminal of a first thin film transistor at a first circuit node, a second capacitor having a terminal electrically coupled to a first semiconductor terminal of a second thin film transistor at a second circuit node, and a third thin film transistor having a first semiconductor terminal electrically coupled to the first circuit node, and a second semiconductor terminal electrically coupled to the second circuit node. The memory device comprises a first wordline electrically coupled to a gate terminal of the first transistor, a second wordline electrically coupled to a gate terminal of the second transistor, an isolation wordline electrically coupled to a gate terminal of the third transistor, and a bitline electrically coupled to a second semiconductor terminal of the first transistor, and electrically coupled to a second semiconductor terminal of the second transistor.

In one or more second examples, for any of the first examples the first and second capacitors include a second terminal electrically coupled to a reference voltage source, the first wordline is electrically coupled to a first wordline driver operable to bias the first wordline to a positive voltage, the second wordline is electrically coupled to a second wordline driver operable to bias the second wordline to a positive voltage, and the isolation wordline is electrically coupled to a third wordline driver operable to maintain a negative voltage on the isolation wordline.

In one or more third examples, for any of the first or second examples the semiconductor terminals of the first, second, and third transistors comprise portions of a continuous layer of a semiconductor material comprising oxygen.

In one or more fourth examples, for any of the first, second, or third examples the isolation wordline, along with the first and second wordlines, comprise a wordline repeat unit including three adjacent gate terminal traces. The bitline is one of a plurality of bitlines crossed by a plurality of the wordline repeat units. The semiconductor terminals of all transistors electrically coupled to an individual one of the bitlines comprise portions of a continuous stripe of a semiconductor material comprising oxygen and extending in a direction parallel to the bitline.

In one or more fifth examples, for any of the fourth examples the three gate terminal traces cross a plurality of the semiconductor stripes, and individual ones of the stripes corresponding to transistors coupled to individual ones of the bitlines.

In one or more sixth examples, for any of the first, second, third, fourth, or fifth examples the first, second and third transistors comprise a gate dielectric between the gate terminals and an amorphous or polycrystalline semiconductor material. A first contact metallization is in contact with the second semiconductor terminal of the first transistor. A second contact metallization is in contact with the second semiconductor terminal of the second transistor. A third contact metallization is in contact with the first semiconductor terminal of the first transistor and the first semiconductor terminal of the third transistor. A fourth contact metallization is in contact with the first semiconductor terminal of the second transistor and the second semiconductor terminal of the third transistor, and the contact metallizations are separated from the gate terminals by a dielectric spacer.

In one or more seventh examples, for any of the sixth examples, the first wordline comprises the gate terminal of the first transistor, and an interconnect metallization trace extending in a direction parallel to the gate terminal of the first transistor, wherein the interconnect metallization trace is electrically coupled to the gate terminal of the first transistor in at least two points.

In one or more eighth examples, for any of the seventh examples the second wordline comprises the gate terminal of the second transistor and an interconnect metallization trace extending in a direction parallel to the gate terminal of the second transistor, and electrically coupled to the gate terminal of the second transistor in at least two points.

In one or more ninth examples, for any of the eighth examples the interconnect metallization traces coupled to the first and second gate terminals are adjacent to each other, and have a pitch equal to approximately 1.5 times the pitch of the gate terminals.

In one or more tenth examples, for any of the eighth or ninth examples the interconnect metallization traces are within a metallization level below the transistors. The bitline comprises an interconnect metallization trace within a metallization level above the transistors. The interconnect metallization traces are coupled to the gate terminals through the metallization level above the transistors.

In one or more eleventh examples, for any of the first through tenth examples, the semiconductor material comprises indium gallium zinc oxide (IGZO).

In one or more twelfth examples, for any of the first through eleventh examples the first and second capacitor terminals comprise a metallization level above the gate terminals. The bitline comprises an interconnect metallization trace within a metallization level between the gate terminals and the capacitor terminals.

In one or more thirteenth examples, for any of the twelfth examples the capacitor terminals are electrically coupled to the first terminals of the first and second transistors through metallization traces fabricated within the same metallization level as the bitline interconnect metallization trace.

In one or more fourteenth examples, for any of first through thirteenth examples the capacitors comprise a second terminal electrically coupled through one or more metallization levels to a bias circuit comprising a plurality of field effect transistors (FETs). Individual ones of the FETs comprise a monocrystalline semiconductor channel, and the bias circuit is operable to tie the second capacitor terminals to a reference potential.

In one or more fifteenth examples, for any of the fourteenth examples the wordlines are electrically coupled through one or more metallization levels to row circuitry comprising a second plurality of the FETs. The bitline is electrically coupled through one or more metallization levels to column circuitry comprising a third plurality of the FETs.

In one or more sixteenth examples, a computer platform includes one or more processor, and the memory device as in any one of the first through fifteenth examples.

In one or more seventeenth examples, an integrated circuit memory device includes peripheral circuitry comprising a plurality of field effect transistors (FETs). Individual ones of the FETs comprise a monocrystalline semiconductor channel. The memory device also includes a memory cell array monolithically integrated with the peripheral circuitry. The array includes a plurality of thin film transistors (TFTs) electrically coupled to wordlines extending in a row direction and bitlines extending in a column direction, orthogonal to the row direction. Individual ones of the TFTs employ a polycrystalline or amorphous semiconductor channel. The peripheral circuitry includes first column circuitry, at least a portion of which resides within a footprint of the array, located at a first edge of the array and electrically coupled to first bitlines. The peripheral circuitry includes second column circuitry, at least a portion of which resides within the footprint of the array, located at a second edge of the array, opposite the first edge, and electrically coupled to second bitlines. The peripheral circuitry includes row circuitry, all of which resides within footprint of the array, located between the first and second column circuitry and electrically coupled to the wordlines. The peripheral circuitry includes control circuitry, at least a portion of which resides within the footprint of the array, located between the first and second column circuitry and on opposite sides of the row circuitry.

In one or more eighteenth examples, for any of the seventeenth examples the first column circuitry comprises first bitline sense amplifiers. The second column circuitry comprises second bitline sense amplifiers. The control circuitry comprises first control circuitry located on a first side of the row circuitry, and electrically coupled to adjacent first portions of the first and second column circuitry. The control circuitry comprises second control circuitry located on a second side of the row circuitry, opposite the first control circuitry, and electrically coupled to adjacent second portions of the first and second column circuitry.

In one or more nineteenth examples, for any of the eighteenth examples the array includes capacitors having first terminals electrically coupled to first semiconductor terminals of individual ones of the TFTs. Second semiconductor terminals of a first plurality of the TFTs are electrically coupled together to a first of the bitlines. Gate terminals of a second plurality of the TFTs are electrically coupled together to a first of the wordlines. Gate terminals of a third plurality of the TFTs are electrically coupled together to a second of the wordlines. First and second semiconductor terminals of the third plurality of the TFTs are electrically coupled to the first terminals of the capacitors.

In one or more twentieth examples, for any of the nineteenth examples the row circuitry includes first wordline driver circuitry operable to bias any of the first of the wordlines to a positive voltage, second wordline driver circuitry operable to bias the second of the wordlines to a negative voltage while any of the first wordlines is biased to the positive voltage.

In one or more twenty-first examples, a method of fabricating an integrated circuit memory device comprises depositing a semiconductor thin film over a dielectric material, depositing a gate dielectric over the semiconductor thin film, patterning at least the semiconductor thin film into a plurality parallel stripes extending in a first direction, forming a plurality of a parallel gate electrodes crossing the semiconductor stripes, forming contact metallization over the semiconductor stripes and between the gate electrodes, the contact metallization separated from the gate electrodes by a dielectric spacer, forming a bitline comprising a metallization trace over individual ones of the semiconductor stripes, the bitline electrically coupled to a plurality of drain regions within a corresponding semiconductor stripe, and forming a plurality of capacitors over individual ones of the semiconductor stripes, the capacitors electrically coupled to a plurality of source regions within a corresponding semiconductor stripe.

In one or more twenty-second examples, for any of the twenty-first examples the semiconductor comprises oxygen, and for every three adjacent gate electrodes, the bitline is electrically coupled to two drain regions.

In one or more twenty-third examples, for any of the twenty-first or twenty-second examples the method further comprises forming a peripheral circuit prior to depositing the semiconductor thin film over the peripheral circuit. Forming the peripheral circuit further comprises forming a plurality of field effect transistor (FET) structures, and forming one or more metallization levels interconnecting the FET structures into the peripheral circuit. Forming the capacitors further comprises forming metal-insulator-metal capacitors in metallization levels above the bitline.

In one or more twenty-fourth examples, for any of the twenty-first through twenty-third examples the method further comprises forming a plurality of wordline shunts in a metallization level below the semiconductor thin film, individual ones of the wordline shunts comprising a metallization trace extending parallel to the gate electrodes and electrically coupled to one of the gate electrodes at two or more points along the length of the gate electrode.

In one or more twenty-fifth examples, for every three adjacent gate electrodes in the twenty-fourth examples, there is a pair of the wordline shunts.

In one or more twenty-sixth examples, for any of the twenty-first through twenty-fifth examples forming the gate electrode further comprises forming a sacrificial gate over the gate dielectric, forming the dielectric spacer along a sidewall of the sacrificial gate, depositing a gap-fill material over the sacrificial gate and the dielectric spacer, planarizing the gap-fill material with the sacrificial gate, removing the sacrificial gate without removing the dielectric spacer, and depositing the gate electrode in an opening generated by removing the sacrificial gate.

In one or more twenty-seventh examples, for any of the twenty-sixth examples forming the dielectric spacer further comprises depositing a dielectric material over the sacrificial gate and the gate dielectric and anisotropically etching the dielectric material into the dielectric spacer, the etching stopping on the gate dielectric.

In one or more twenty-eighth examples, for any of the twenty-sixth or twenty-seventh examples forming the contact metallization further comprises removing the gap-fill material adjacent to the spacer without removing the dielectric spacer, removing the gate dielectric not protected by the gate electrode, dielectric spacer, or the gap-fill material, depositing the contact metallization, and planarizing the source/drain contact metallization with the gap fill material.

In one or more twenty-ninth examples, for any of the twenty-first through twenty-eighth examples depositing the semiconductor thin film further comprises depositing an amorphous thin film of a tin oxide, zinc oxide, or titanium oxide.

In one or more thirtieth examples, a method of fabricating an integrated circuit memory device comprises forming peripheral circuitry comprising a plurality of field effect transistors (FETs) with a monocrystalline semiconductor channel material, and forming a memory cell array monolithically integrated with the peripheral circuitry. The array includes a plurality of thin film transistors (TFTs) electrically coupled to wordlines extending in a row direction and bitlines extending in a column direction, orthogonal to the row direction, wherein individual ones of the TFTs are fabricated with a polycrystalline or amorphous semiconductor channel material. The peripheral circuitry includes first column circuitry, at least a portion of which resides within a footprint of the array, located at a first edge of the array and electrically coupled to a first subset of the bitlines. The peripheral circuitry includes second column circuitry, at least a portion of which resides within the footprint of the array, located at a second edge of the array, opposite the first edge, and electrically coupled to a second subset of the bitlines. The peripheral circuitry includes row circuitry, all of which resides within footprint of the array, located between the first and second column circuitry and electrically coupled to the wordlines. The peripheral circuitry includes control circuitry, at least a portion of which resides within the footprint of the array, located between the first and second column circuitry and on opposite sides of the row circuitry.

In one or more thirty-first examples, for any of the thirtieth examples the first column circuitry comprises first bitline sense amplifiers, the second column circuitry comprises second bitline sense amplifiers, and the control circuitry comprises first control circuitry located on a first side of the row circuitry, and electrically coupled to adjacent first portions of the first and second column circuitry, and second control circuitry located on a second side of the row circuitry, opposite the first control circuitry, and electrically coupled to adjacent second portions of the first and second column circuitry.

In one or more thirty-second examples, for any of the thirtieth or thirty-first examples the array includes capacitors having first terminals electrically coupled to first semiconductor terminals of individual ones of the TFTs. Second semiconductor terminals a first plurality of the TFTs are electrically coupled together to a first of the bitlines. Gate terminals of a second plurality of the TFTs are electrically coupled together to a first of the wordlines. Gate terminals of a third plurality of the TFTs are electrically coupled together to a second of the wordlines. First and second semiconductor terminals of the third plurality of the TFTs are electrically coupled to the first terminals of the capacitors.

In one or more thirty-third examples, for any of the thirty-second examples the first subset of bitlines are odd numbered columns of the memory array that are interdigitated with even numbered columns of the memory array.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit memory device, comprising:
    a memory array, comprising:
        a first capacitor having a terminal electrically coupled to a first semiconductor terminal of a first thin film transistor at a first circuit node;
        a second capacitor having a terminal electrically coupled to a first semiconductor terminal of a second thin film transistor at a second circuit node;
        a third thin film transistor having a first semiconductor terminal electrically coupled to the first circuit node, and a second semiconductor terminal electrically coupled to the second circuit node, wherein the semiconductor terminals of the first, second, and third thin film transistors comprise portions of a continuous layer of a semiconductor material comprising oxygen;
        a first wordline electrically coupled to a gate terminal of the first thin film transistor;
        a second wordline electrically coupled to a gate terminal of the second thin film transistor;
        an isolation wordline electrically coupled to a gate terminal of the third thin film transistor;
        a bitline electrically coupled to a second semiconductor terminal of the first thin film transistor, and electrically coupled to a second semiconductor terminal of the second thin film transistor; and
    memory circuitry comprising a plurality of wordline drivers coupled to the wordlines through one or more metallization levels, wherein the wordline drivers comprise a plurality of field effect transistors (FETs) that are at least partially under the memory array, and wherein individual ones of the FETs comprise a monocrystalline semiconductor channel material.

2. The device of claim 1, wherein:
    the first and second capacitors include a second terminal electrically coupled to a reference voltage source;
    the first wordline is electrically coupled to a first wordline driver operable to bias the first wordline to a positive voltage;
    the second wordline is electrically coupled to a second wordline driver operable to bias the second wordline to a positive voltage; and
    the isolation wordline is electrically coupled to a third wordline driver operable to maintain a negative voltage on the isolation wordline.

3. The device of claim 1, wherein:
    the isolation wordline, along with the first and second wordlines comprise a wordline repeat unit including three adjacent gate terminal traces;
    the bitline is one of a plurality of bitlines crossed by a plurality of the wordline repeat units; and
    the semiconductor terminals of all thin film transistors electrically coupled to an individual one of the bitlines comprise portions of a continuous stripe of a semiconductor material comprising oxygen and extending in a direction parallel to the bitline.

4. The device of claim 3, wherein the three gate terminal traces cross a plurality of the semiconductor stripes, and individual ones of the stripes correspond to thin film transistors coupled to individual ones of the bitlines.

5. The device of claim 1, wherein:
    the first, second and third thin film transistors comprise a gate dielectric between the gate terminals and an amorphous or polycrystalline semiconductor material;
    a first contact metallization is in contact with the second semiconductor terminal of the first thin film transistor;
    a second contact metallization is in contact with the second semiconductor terminal of the second thin film transistor;
    a third contact metallization is in contact with the first semiconductor terminal of the first thin film transistor and the first semiconductor terminal of the third thin film transistor;
    a fourth contact metallization is in contact with the first semiconductor terminal of the second thin film transistor and the second semiconductor terminal of the third thin film transistor; and
    the contact metallizations are separated from the gate terminals by a dielectric spacer.

6. The device of claim 1, wherein:
the first wordline comprises the first interconnect metallization trace extending in a direction parallel to the gate terminal of the first thin film transistor, and wherein the first interconnect metallization trace is electrically coupled to the gate terminal of the first thin film transistor in at least two points; and
the second wordline comprises a second interconnect metallization trace extending in a direction parallel to the gate terminal of the second thin film transistor, and electrically coupled to the gate terminal of the second thin film transistor in at least two points.

7. The device of claim 6, wherein the isolation wordline comprises the gate terminal of the third thin film transistor but lacks an interconnect metallization trace extending in a direction parallel to the gate terminal of the third thin film transistor, and electrically coupled to the gate terminal of the third thin film transistor in at least two points.

8. The device of claim 6, wherein:
the first and second interconnect metallization traces are adjacent to each other, and have a pitch equal to approximately 1.5 times the pitch of the gate terminals of the first, second and third thin film transistors.

9. The device of claim 8, wherein:
the first and second interconnect metallization traces are within a metallization level below the thin film transistors;
the bitline comprises an interconnect metallization trace within a metallization level above the thin film transistors; and
the first and second interconnect metallization traces are coupled to the gate terminals through the metallization level above the thin film transistors.

10. The device of claim 1, wherein the semiconductor material comprises indium gallium zinc oxide (IGZO).

11. The device of claim 1, wherein:
the first and second capacitor terminals comprise a metallization level above the gate terminals; and
the bitline comprises an interconnect metallization trace within a metallization level between the gate terminals and the capacitor terminals.

12. The device of claim 11, the capacitor terminals are electrically coupled to the first terminals of the first and second thin film transistors through metallization traces fabricated within the same metallization level as the bitline interconnect metallization trace.

13. The device of claim 1, wherein:
the memory circuitry further comprises a bias circuit to tie the second capacitor terminals to a reference potential;
the capacitors comprise a second terminal electrically coupled through one or more metallization levels to the bias circuit; and
the bias circuit comprises a plurality of FETs comprising a monocrystalline semiconductor channel.

14. The device of claim 13, wherein:
the memory circuitry further comprises row circuitry comprising a second plurality of FETs at least partially below the memory array, and column circuitry comprising a third plurality of FETs at least partially under the memory array;
the wordlines are electrically coupled through one or more metallization levels to the row circuitry; and
the bitline is electrically coupled through one or more metallization levels to the column circuitry.

15. A computer platform including:
one or more processors; and
a memory device, comprising:
a memory array, comprising:
a first capacitor having a terminal electrically coupled to a first semiconductor terminal of a first thin film transistor at a first circuit node;
a second capacitor having a terminal electrically coupled to a first semiconductor terminal of a second thin film transistor at a second circuit node;
a third thin film transistor having a first semiconductor terminal electrically coupled to the first circuit node, and a second semiconductor terminal electrically coupled to the second circuit node, wherein the semiconductor terminals of the first, second, and third thin film transistors comprise portions of a continuous layer of a semiconductor material comprising oxygen;
a first wordline electrically coupled to a gate terminal of the first thin film transistor;
a second wordline electrically coupled to a gate terminal of the second thin film transistor;
an isolation wordline electrically coupled to a gate terminal of the third thin film transistor; and
a bitline electrically coupled to a second semiconductor terminal of the first thin film transistor, and electrically coupled to a second semiconductor terminal of the second thin film transistor; and
memory circuitry comprising a plurality of wordline drivers coupled to the wordlines through one or more metallization levels, wherein the wordline drivers comprise a plurality of field effect transistors (FETs) that are at least partially under the memory array, and wherein individual ones of the FETs comprise a monocrystalline semiconductor channel material.

* * * * *